(12) United States Patent
Lin

(10) Patent No.: US 9,994,971 B2
(45) Date of Patent: Jun. 12, 2018

(54) METHOD FOR FABRICATING CARBON-BASED COMPOSITE MATERIAL

(71) Applicant: Tamkang University, New Taipei (TW)

(72) Inventor: I-Nan Lin, New Taipei (TW)

(73) Assignee: TAMKANG UNIVERSITY, New Taipei (TW)

( * ) Notice: Subject to any disclaimer, the term of this patent is extended or adjusted under 35 U.S.C. 154(b) by 0 days. days.

(21) Appl. No.: 15/366,525

(22) Filed: Dec. 1, 2016

(65) Prior Publication Data
US 2017/0159205 A1    Jun. 8, 2017

(30) Foreign Application Priority Data

Dec. 3, 2015    (TW) .............................. 104140579 A

(51) Int. Cl.
| | |
|---|---|
| *C30B 33/04* | (2006.01) |
| *C30B 29/04* | (2006.01) |
| *C23C 16/26* | (2006.01) |
| *C30B 25/10* | (2006.01) |

(Continued)

(52) U.S. Cl.
CPC .............. *C30B 29/04* (2013.01); *C23C 16/26* (2013.01); *C23C 16/511* (2013.01); *C30B 25/105* (2013.01); *C30B 29/60* (2013.01)

(58) Field of Classification Search
CPC .. C30B 1/00; C30B 1/02; C30B 25/00; C30B 25/02; C30B 25/10; C30B 25/105; C30B 25/16; C30B 25/18; C30B 25/186; C30B 28/00; C30B 28/12; C30B 28/14; C30B 29/00; C30B 29/02; C30B 29/04; C30B 29/60; C30B 33/00; C30B 33/02; C30B 33/04; C23C 16/26; C23C 16/511
USPC ......... 117/4, 7–9, 84, 88, 94, 101, 103, 106, 117/108, 906, 928–929
See application file for complete search history.

(56) References Cited

PUBLICATIONS

C.-J. Yeh, et al. publication entitled "Synthesis of ultra-nano-carbon composite materials with extremely high conductivity by plasma post-treatment process of ultrananocrystalline diamond films," Appl. Phys. Lett. vol. 107, pp. 083104-083111 (2015).*

(Continued)

*Primary Examiner* — Kenneth A Bratland, Jr.
(74) *Attorney, Agent, or Firm* — Andrew M. Calderon; Roberts Mlotkowski Safran Cole & Calderon, P.C.

(57) ABSTRACT

A method for fabricating a carbon-based composite material includes: bearing a carbon-based composite material layer containing an amorphous carbon matrix and a plurality of equi-axed ultrananocrystalline diamond grains dispersed in the amorphous carbon matrix on a susceptor and applying a plasma treatment on the carbon-based composite material layer in a plasma environment containing a $C_2$ species and a CN species. The susceptor is provided with a negative bias voltage, and is bombarded by the plasma species to be naturally heated to a working temperature less than 500° C. The $C_2$ species and CN species are attracted by the negative bias voltage to the carbon-based composite material layer to make the carbon-based composite material layer generate a phase transformation, so as to facilitate growth of each of the adjacent equi-axed ultrananocrystalline diamond into a nano needle-like diamond grain wrapped by a nano graphite phase.

9 Claims, 19 Drawing Sheets

(51) Int. Cl.
C30B 29/60 (2006.01)
C23C 16/511 (2006.01)

(56) References Cited

PUBLICATIONS

Cheng et al., "Enhanced electron field emission properties by tuning the microstructure of ultrananocrystalline diamond film", Journal of Applied Physics 109, Feb. 4, 2011, 8 pages.
Saravanan et al., "Low temperature synthesis of diamond-based nano-carbon composite materials with high electron field emission properties", Applied Physics Letters 106, 2015, 6 pages.
Sankaran et al., "Origin of a needle-like granular structure for ultrananocrystalline diamond films grown in a N2/CH4 plasma", Journal of Physics D: Applied Physics, 45, Aug. 21, 2012, 10 pages.
Yeh et al., "Synthesis of ultra-nano-carbon composite materials with extremely high conductivity by plasma post-treatment process of ultrananocrystalline diamond films", Applied Physics Letters 107, 2015, 6 pages.

* cited by examiner

METHOD FOR FABRICATING CARBON-BASED COMPOSITE MATERIAL

CROSS-REFERENCE TO RELATED APPLICATION

This non-provisional application claims priority under 35 U.S.C. § 119(a) to Patent Application No. 104140579 in Taiwan, R.O.C. on Dec. 3, 2015, the entire contents of which are hereby incorporated by reference.

BACKGROUND

Technical Field

The present invention relates to a carbon-based composite material, and in particular, to a method for fabricating a carbon-based composite material.

Related Art

Persons skilled in the art all know that diamond is formed of $sp^3$-bonding carbon. In addition, diamond and relevant materials thereof are widely used by the industry owing to outstanding physical and chemical properties thereof. Using physical properties of diamond as an example, it is advantageous to use diamond films as materials for fabricating emitters of field emission owing to excellent electron field emission (EFE in short) properties of the diamond films. On such basis, in recent ten years, reports relevant to research, development, discussion, etc. of carbon-based composite materials have constantly appeared in the industry.

The inventor disclosed a method for synthesizing a composite diamond film of microcrystalline diamond-ultrananocrystalline diamond (MCD-UNCD) in the article Enhanced electron field emission properties by tuning the microstructure of ultrananocrystalline diamond film (called earlier case 1 below) published in Journal of Applied Physics 109, 033711 (2011). The method for synthesizing a composite diamond film of the earlier case 1 is first performing ultrasonic agitation on a plurality of n-type (100) silicon substrates separately in a solution containing diamond powder with a grain size of about 1 nm for 30 min, and then performing ultrasonic cleaning by using acetone to remove fine grains adsorbed on each of the n-type silicon substrates; next, depositing each of the cleaned n-type silicon substrates in a first plasma atmosphere containing argon (Ar) and methane (called $CH_4$ below, 2%) for 60 min by means of microwave plasma enhanced chemical vapor deposition (MPECVD), so as to form a UNCD seeding layer on a surface of each of the n-type silicon substrates, where the UNCD seeding layer is grown on an amorphous carbon layer with a thickness of about 1 nm, and is formed by UNCD grains, a grain size of which is about 5 nm, a grain boundary of which is an amorphous carbon matrix, and a thickness of which is about 300-1000 nm; and finally, depositing, also by means of MPECVD, each n-type silicon substrate with the UNCD diamond seeding layer formed on the surface thereof in a second plasma atmosphere containing $CH_4$/Ar/hydrogen (call $H_2$ below) in a ratio of 1/(99−x)/x (where x is 0, 25, 50, 75, and 90) for 30 min, 60 min, or 90 min, so as to form an MCD layer on each UNCD diamond seeding layer.

The research of the earlier case 1 points out that by means of the synthesis method, the composite diamond film obtained by performing deposition for 60 min under the condition that the ratio of $CH_4$/Ar/$H_2$ in the second plasma atmosphere is 1/49/50 can obtain the optimal EFE property; that is, a turn on electric field (called $E_0$ below) of 6.5 V/μm, and a current density (called J below) reaches 1 mA/cm² under the condition that an applied electric field (called $E_a$ below) is 30 V/μm.

Further, the inventor disclosed a method for growing an ultrananocrystalline diamond film (called UNCD below) having a needle-like granular structure in the article Origin of a needle-like granular structure for ultrananocrystalline diamond films grown in a $N_2$/$CH_4$ plasma (called earlier case 2) published in J. Phy. D: Appl. Phys. 45 (2012) 365303 (9pp). The growth method of the earlier case 2 is first performing ultrasonic agitation on a plurality of n-type (100) silicon substrates separately in a solution containing diamond powder with a grain size of about 30 nm, titanium (Ti) powder with a screen size of 325 nm, and methanol for 45 min, so as to generate a plurality of nucleation sites on a surface of each of the n-type silicon substrates; next, providing each of the n-type silicon substrates in an MPECVD system (IPLAS-CYRANNUS, 2.45 GHz) to heat the surface thereof to deposition temperatures such as 550° C., 600° C., 650° C., 700° C., 750° C., and 850° C., and introducing a mixed gas containing nitrogen (called $N_2$ below; 94%) and $CH_4$ (6%) into the MPECVD system; and generating a microwave plasma under a working pressure of 50 Torr at the microwave output power of 1200 W, so as to grow a UNCD film on the surface of each of the n-type silicon substrates.

The research of the earlier case 2 points out that at a suitable deposition temperature, a CN species in the microwave plasma used in each process of implementing MPECVD is advantageous to anisotropic grain-growth of ultrananocrystalline diamond in each UNCD film, so as to form nano needle-like diamond grains, and the nano needle-like diamond grains are wrapped by a nano graphite phase, so as to improve the EFE property and various electrical properties of each UNCD film. The EFE property and various electrical properties of the earlier case 2 are simply listed in the following table 1.

TABLE 1

| Deposition temperature (° C.) | Conductivity (S/cm) | $E_0$ (V/μm) | J (mA/cm²) |
|---|---|---|---|
| 550 | 1.2 | 13.02 | 2.38 |
| 600 | 106 | 11.64 | 2.76 |
| 650 | 147 | 7.14 | 3.15 |
| 700 | 186 | 6.13 | 3.36@ |
| 750 | 110 | 9.12 | 2.83 |
| 800 | 90 | 13.71 | 1.99 |

@is obtained when intensity of the applied electric field ($E_a$) is 8.8 V/μm.

According to table 1, it can be known that an excessively low deposition temperature (such as 550° C.) or an excessively high temperature (such as 800° C.) both hinder anisotropic grain-growth, and make the turn on electric field ($E_0$) thereof increase to 13.02 V/μm and 13.71 V/μm respectively; in addition, the conductivity (called σ below) of the UNCD film obtained by growth at the deposition temperature of 550° C. is only 1.2 S/cm. The turn on electric field ($E_0$) and current density (J) of the UNCD film obtained by growth under the condition that the deposition temperature is controlled at 700° C. may decrease to 6.13 V/μm and increase to 3.36 mA/cm² respectively, and the conductivity (σ) may increase to 186 S/cm.

By means of the growth method disclosed in the earlier case 2, the CN species in the microwave plasma used in the process of implementing MPECVD can assist in anisotropic growth of UNCD grains into nano needle-like diamond grains, and the EFE property and electrical properties of the UNCD film thereof can be adjusted by means of different deposition temperatures. However, in the earlier case 2, the deposition temperature at which the optimal EFE property and electrical properties are obtained reaches up to 700° C.

According to the foregoing description, it can be known that constantly looking for different methods for fabricating a carbon-based composite material to improve an electron field emission (EFE) property and improve electrical properties thereof is a difficult problem to be overcome by persons skilled in the art.

SUMMARY

Therefore, the objective of the present invention lies in providing a method for fabricating a carbon-based composite material.

Then, a method for fabricating a carbon-based composite material of the present invention includes: placing a carbon-based composite material layer containing an amorphous carbon matrix and a plurality of equi-axed ultrananocrystalline diamond (UNCD) dispersed in the amorphous carbon matrix in a plasma environment containing a $C_2$ species and a CN species for a plasma treatment. In the present invention, a part of the equi-axed ultrananocrystalline diamond have a grain size ($\varphi$), and there is a distance (d) between adjacent equi-axed ultrananocrystalline diamond in this part, where $\varphi \leq 5$ nm and $d \geq 0.05$ nm; a susceptor that bears the carbon-based composite material layer is provided with a negative bias voltage (Vb), and the susceptor is not additionally heated so that the susceptor is bombarded by the plasma species to be naturally heated to a working temperature less than 500° C.; the $C_2$ species and CN species in the plasma environment are attracted by the negative bias voltage to the carbon-based composite material layer to make the adjacent equi-axed ultrananocrystalline diamond in this part and the amorphous carbon matrix located therebetween generate a phase transformation, thereby facilitating anisotropic growth of each of the adjacent equi-axed ultrananocrystalline diamond in this part into a nano needle-like diamond grain, each nano needle-like diamond grain being wrapped by a nano graphite phase; and at least one of a preparation time for which the plasma treatment is applied and the negative bias voltage (Vb) provided for the susceptor is enough to enable the carbon-based composite material layer after the plasma treatment to have a turn on electric field ($E_0$) less than 5.9 V/μm.

The effect of the present invention: the negative bias voltage (Vb) is provided for the susceptor under the condition that the susceptor is not additionally heated so that the susceptor is bombarded by the plasma species to be naturally heated to a working temperature less than 500° C., so that plasma treatment for the preparation time is applied to the carbon-based composite material layer in the plasma environment containing the $C_2$ species and CN species, thereby reducing the turn on electric field ($E_0$) of the carbon-based composite material layer under a lower-temperature condition.

BRIEF DESCRIPTION OF THE DRAWINGS

The present invention will become more fully understood from the detailed description given herein below for illustration only, and thus are not limitative of the present invention, and wherein.

Other features and effects of the present invention will be clearly presented in implementation manners with reference to accompanying drawings, wherein.

DETAILED DESCRIPTION

Figure 1:
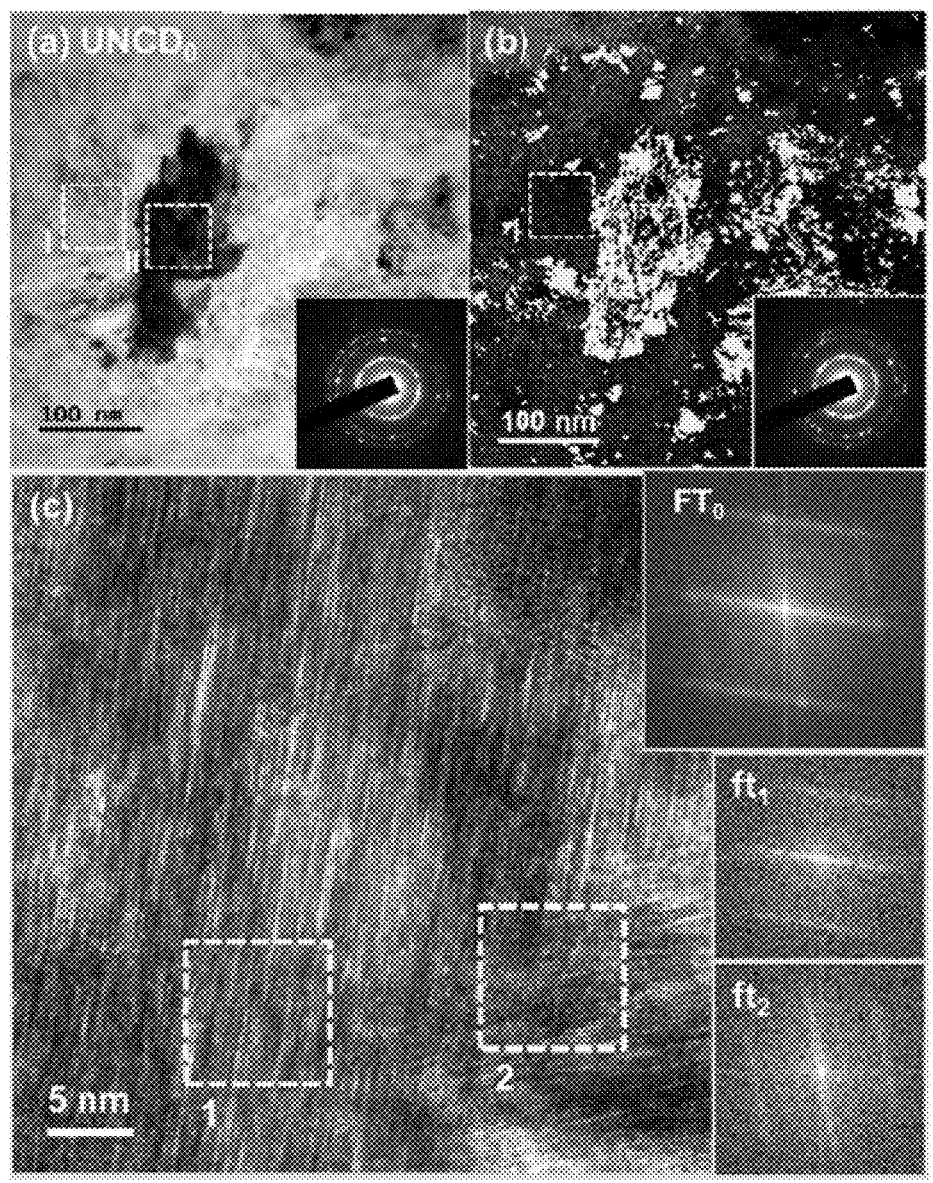
FIG. 1 is an image of a transmission electron microscope (TEM in short below), and describes a microstructure of a carbon-based composite material layer of a comparative example 0 (CE0) of the present invention.

An embodiment of a method for fabricating a carbon-based composite material of the present invention is provided, where the method includes: placing a carbon-based composite material layer containing an amorphous carbon matrix and a plurality of equi-axed ultrananocrystalline diamond dispersed in the amorphous carbon matrix in a plasma environment containing a $C_2$ species and a CN species for a plasma treatment. In the present invention, a part of the equi-axed ultrananocrystalline diamond have a grain size ($\varphi$), and there is a distance (d) between adjacent equi-axed ultrananocrystalline diamond in this part, where $\varphi \leq 5$ nm and $d \geq 0.05$ nm; a susceptor that bears the carbon-based composite material layer is provided with a negative bias voltage (Vb), and the susceptor is not additionally heated so that the susceptor is bombarded by the plasma species to be naturally heated to a working temperature less than 500° C.; the $C_2$ species and CN species in the plasma environment are attracted by the negative bias voltage to the carbon-based composite material layer to make the adjacent ultrananocrystalline diamond in this part and the amorphous carbon matrix located therebetween generate a phase transformation, thereby facilitating anisotropic growth of each of the adjacent equi-axed ultrananocrystalline diamond in this part into a nano needle-like diamond grain, each nano needle-like diamond grain being wrapped by a nano graphite phase; and at least one of a preparation time for which the plasma treatment is applied and the negative bias voltage (Vb) provided for the susceptor is enough to enable the carbon-based composite material layer after the plasma treatment to have a turn on electric field ($E_0$) less than 5.9 V/μm.

It should be supplemented herein that when this embodiment of the present invention is actually implemented, the susceptor is not additionally heated (that is, the susceptor is bombarded by the plasma species to be naturally heated to a working temperature less than 500° C.), and $E_0$ of the carbon-based composite material layer after the plasma treatment is determined according to the preparation time of the plasma treatment or the negative bias voltage (Vb) provided for the susceptor. In other words, to keep $E_0$ of the carbon-based composite material layer after the plasma treatment below 5.9 V/μm, the preparation time in the plasma treatment or the negative bias voltage (Vb) are main factors that determine $E_0$ of the carbon-based composite material layer after the plasma treatment. Further in detail, when the negative bias voltage (Vb) provided for the susceptor of this embodiment is increased, the preparation time in the plasma treatment may be relatively reduced; relatively, when the preparation time in the plasma treatment is extended, the negative bias voltage (Vb) provided for the susceptor of this embodiment may be relatively decreased. It is more worth mentioning herein that although the preparation time or the negative bias voltage (Vb) of the plasma treatment are main factors that determine $E_0$ of the carbon-based composite material layer after the plasma treatment, to further reduce $E_0$ of the carbon-based composite material layer after the plasma treatment, the preparation time may be extended and at the same time, the negative bias voltage (Vb) provided for the susceptor may be increased when the plasma treatment is implemented.

Preferably, each nano needle-like diamond grain has a wire diameter ($\xi$) and a length (l), $\xi \leq 5$ nm, and $l \geq 100$ nm, and each nano graphite phase includes at least three layers of graphene-like.

Preferably, the $C_2$ species and CN species in the plasma environment are formed by pyrolyzing a mixed gas, and the mixed gas contains a hydrocarbon gas molecule and a gas molecule that contains nitrogen (N). More preferably, the hydrocarbon gas molecule is selected from methane ($CH_4$), acetylene ($C_2H_2$), or a combination of methane and acetylene, and the gas molecule that contains nitrogen is nitrogen ($N_2$). Further preferably, the hydrocarbon gas molecule is methane; and in volume percent of the mixed gas, methane ($CH_4$) ranges between 1% and 10%, and nitrogen ($N_2$) ranges between 90% and 99%. Further more preferably, methane ($CH_4$) ranges between 5% and 7%, and nitrogen ($N_2$) ranges between 93% and 95%.

Preferably, Vb ranges between −50 V and −600 V. More preferably, Vb ranges between −100 V and −450 V; the working temperature is not greater than 450° C.; and the preparation time in the plasma treatment ranges between 20 min and 90 min.

Preferably, the carbon-based composite material layer is formed on a silicon substrate by pyrolyzing a reactant gas containing argon (Ar) and trace methane ($CH_4$) by means of microwave plasma enhanced chemical vapor deposition (MPECVD), and the silicon substrate is the susceptor.

Examples (E) and Comparative Examples (CE)

Before the fabrication method of the present invention is specifically described, a deposition method of a carbon-based composite material layer of each example (E) and comparative example (CE) is simply described below.

First, ultrasonic agitation is performed on two silicon wafers with a size of 3 cm×3 cm in a solution containing diamond powder with a grain size of about 5 nm, titanium powder with a grain size of about 32.5 nm and methanol, so as to generate a plurality of nucleation sites on a surface of each of the silicon wafers. Next, each of the silicon wafers is provided in the MPECVD system, and a reactant gas containing $CH_4$ (2%) and Ar (98%) is introduced into the MPECVD system; and a microwave plasma is generated under a working pressure of 150 Torr at the microwave output power of 1000 W, so as to deposit into a carbon-based composite on a surface of each of the silicon wafers in a deposition time of 60 min. Finally, each of the silicon wafers with the surface being deposited with the carbon-based composite is cut into a plurality of test pieces, each with a size of 1 cm×1 cm; that is, each test piece has a silicon substrate with a size of 1 cm×1 cm, and a carbon-based composite material layer (called primary layer below) deposited on each of the silicon substrates. In the present invention, one of the primary layers is used as the comparative example 0 (CE0) of the present invention. In addition, in each example (E) and comparative example (CE) of the present invention, each cut silicon substrate is used as a susceptor that bears the carbon-based composite material layer.

According to a TEM image of a primary layer of the comparative example 0 (CE0) displayed in FIG. 1 it can be known that a plurality of equi-axed ultrananocrystalline diamond (UNCD) is displayed in area I marked by a dotted box in a bright field TEM image of FIG. 1(a); large-size diamond grain aggregates (diamond aggregates) are displayed in area II marked by a dotted box in the bright field TEM image of FIG. 1(a), and a plurality of diffraction rings is displayed in a drawing of selected area electron diffraction (SAED) inserted in a lower right corner of FIG. 1(a), and the diffraction rings correspond to crystal faces (111), (220), (311), and the like of the diamond grains, indicating that the foregoing primary layer is mainly formed of a diamond material, and diffuse rings displayed by the SAED of FIG. 1(a) imply a $sp^2$-bonded amorphous carbon matrix contained in the primary layer. In addition, a dark field TEM image of FIG. 1(b) corresponding to the bright field TEM image of FIG. 1(a) may further show that the diamond grain aggregates displayed in area II marked by the dotted box also have a large quantity of ultrananocrystalline diamond (UNCD) at the same time.

Further, according to a TEM structure image, which is displayed in FIG. 1 (c), of area II marked by the dotted box of FIG. 1(a), it can be known that the diamond grain aggregates are actually equi-axed UNCD aggregates that are close to each other, have thin grain boundaries (that is, the so-called amorphous carbon) (about 0.05 nm to 1.0 nm), and have grain sizes of about 5 nm, and such equi-axed UNCD aggregates have loose structures, and are vulnerable to be pyrolyzed by illumination of electron beams during TEM analysis. Further, a Fourier-transformed diffractogram (called an FT diffractogram below) of an overall TEM structure image of FIG. 1(c) is an $FT_0$ diffractogram inserted into an upper right angle of FIG. 1(c). The $FT_0$ diffractogram of FIG. 1(c) displays fringes combined by a plurality of diffraction spots, indicating that the diamond grain aggregates have a plurality of planar defects. FT diffractograms of area 1 and area 2 marked by the dotted boxes of FIG. 1(c) are an $FT_1$ diffractogram and an $FT_2$ diffractogram inserted on the right side of FIG. 1(c), and respectively describe the planar defects.

According to the TEM analytical description of the primary layer displayed in the foregoing FIG. 1, it can be verified that the primary layer (that is, each carbon-based composite material layer) used by each example of the present invention actually contains the amorphous carbon matrix and the equi-axed ultrananocrystalline diamond (UNCD) dispersed in the amorphous carbon matrix; size grains (φ) of a part of the equi-axed UNCD grains are equal to or less than 5 nm, and distances (d) between adjacent equi-axed UNCD of a part of the equi-axed UNCD grains are equal to or greater than 0.05 nm.

An embodiment 1 (E1) of a method for fabricating a carbon-based composite material of the present invention is simply described below.

The silicon substrate that bears the primary layer of the example 1 (E1) of the present invention is provided in a vacuum cavity into which a mixed gas containing $CH_4$(6%) and $N_2$(94%) is introduced; and a plasma environment is generated under a working pressure of 50 Torr at an output power of 1200 W, so as to implement a plasma treatment with a preparation time of 30 min. In the example 1 (E1), the susceptor is provided with a negative bias voltage (Vb) of −250 V, and is not additionally heated (shown in table 2 below).

Further, specific process parameters of fabrication methods of the examples (E1, E2, E3, E4, E5, E6, E7, E8) and the comparative examples (CE1, CE2, CE3, CE4, CE5, CE6) are simply listed in table 2, table 3, and table 4.

TABLE 2

| Embodiment | Preparation time (mins) | Content of $H_2$ in the mixed gas (vol %) | Working temperature* (° C.) | Bias voltage (V) |
|---|---|---|---|---|
| E1 | 30 | 0.0 | No heating | −250 |
| CE1 | 30 | 0.1 | No heating | −250 |
| CE2 | 30 | 1.0 | No heating | −250 |
| E2 | 60 | 0.0 | No heating | −250 |
| CE3 | 60 | 0.1 | No heating | −250 |
| CE4 | 60 | 1.0 | No heating | −250 |

*the silicon substrate is bombarded by plasma species to be naturally heated to a working temperature less than 500° C.

TABLE 3

| Embodiment | Preparation time (mins) | Content of $H_2$ in the mixed gas (vol %) | Working temperature* (° C.) | Bias voltage (V) |
|---|---|---|---|---|
| CE5 | 10 | 0 | No heating | −200 |
| E3 | 30 | 0 | No heating | −200 |
| E4 | 60 | 0 | No heating | −200 |

*the silicon substrate is bombarded by plasma species to be naturally heated to a working temperature of 450° C., where the working temperature of 450° C. is obtained by measurement using a thermal couple.

TABLE 4

| Embodiment | Preparation time (mins) | Content of $H_2$ in the mixed gas (vol %) | Working temperature* (° C.) | Bias voltage (V) |
|---|---|---|---|---|
| CE6 | 30 | 0 | No heating | 0 |
| E5 | 30 | 0 | No heating | −100 |
| E6 | 30 | 0 | No heating | −200 |
| E7 | 30 | 0 | No heating | −300 |
| E8 | 30 | 0 | No heating | −400 |

*the silicon substrate is bombarded by plasma species to be naturally heated to a working temperature less than 500° C.

Figure 2:
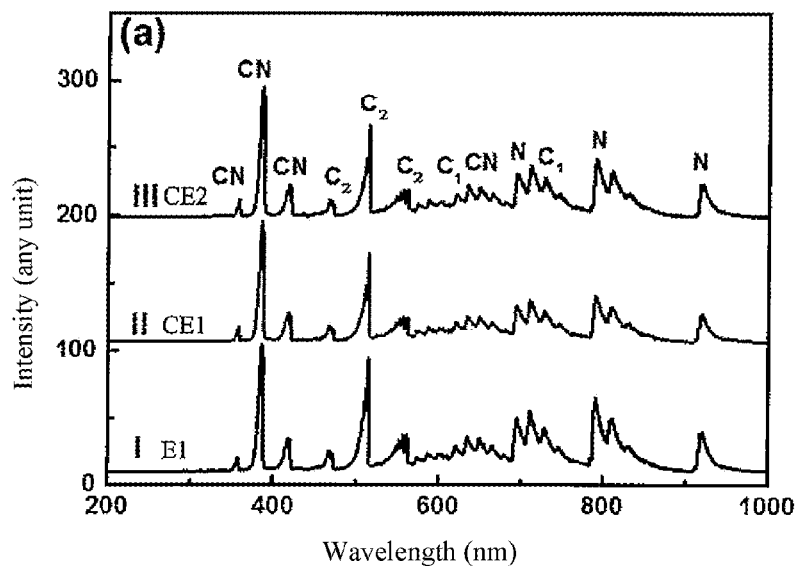
FIG. 2 is a chart of an optical emission spectra (OES in short below), and describes species spectrum of an example 1 (E1), a comparative example 1 (CE1), and a comparative example 2 (CE2) in a plasma environment of the present invention.

FIG. 2 is a chart of an OES of the example 1 (E1) and the comparative examples (CE1, CE2) of the present invention. With reference to FIG. 2, it can be known that a Swan band that represents a $C_2$ species is displayed at 470 nm, 512 nm, 560 nm, and the like, and a CN species is displayed at 386 nm, which preliminarily verifies that there is the $C_2$ species and the CN species in a plasma environment of the example 1 (E1) and the comparative examples (CE1, CE2) of the present invention. In addition, it can be predicted that a CH species and an H species (not shown) exist in the plasma environment of the example 1 (E1) and the comparative examples (CE1, CE2), but the CH species and the H species cannot be detected in the OES chart owing to low concentrations thereof. It should be noted herein that the $C_2$ species and the CN species are main ingredients that relate to the phase transformation.

Figure 3:
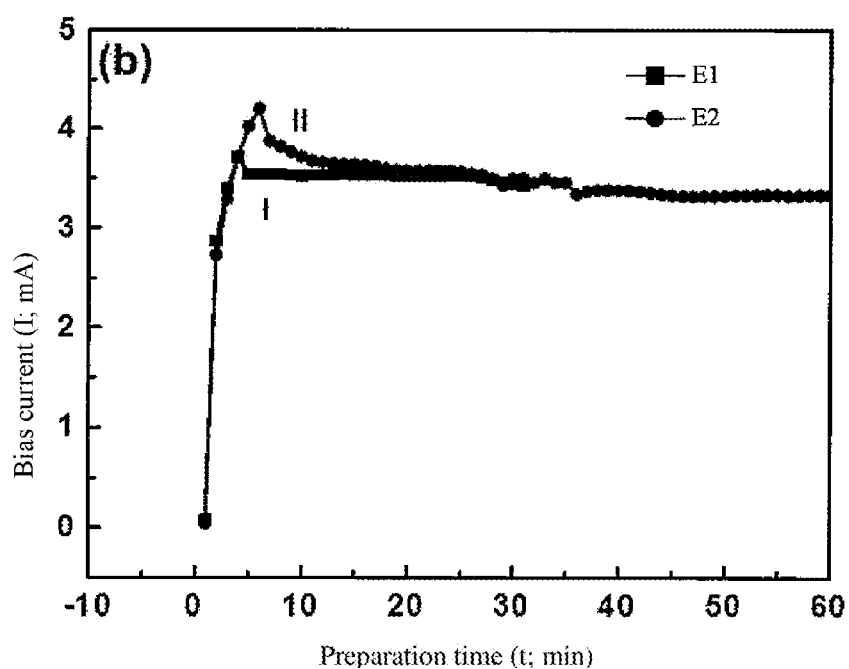
FIG. 3 is a graph of a bias current (I) versus a preparation time (t), and describes changes of a current formed by surface discharge thereof versus a preparation time of plasma treatment in a plasma treatment process of the example 1 (E1) and the example 2 (E2) of the present invention.

With reference to a graph of a bias current (I) versus a preparation time (t) of FIG. 3, it can be known that in the processes of implementing plasma treatments for 30 min and 60 min respectively under the negative bias voltage (Vb) of −250 V on the examples (E1, E2) of the present invention, surface discharge bias current values of the carbon-based composite material layers of the example 1 (E1) and the example 2 (E2) are rapidly increased with the increase of preparation time thereof, and respectively reach saturation under the bias currents of 3.5 mA and 4.2 mA in about 4 min and 6 min respectively, and the increase of the bias currents thereof with the increase of the preparation time is not significant after reaching saturation. It is preliminarily verified that within several minutes, surfaces of the carbon-based composite material layers of the examples (E1, E2) approximately generate the phase transformation due to plasma treatments thereof into nano needle-like diamond grains wrapped by nano graphite phases with good conductivity ($\sigma$); in addition, with the increase of the preparation time, the phase transformation continuously occurs towards the silicon substrate thereof. Analysis data relevant to the foregoing phase transformation is described later.

Figure 4:
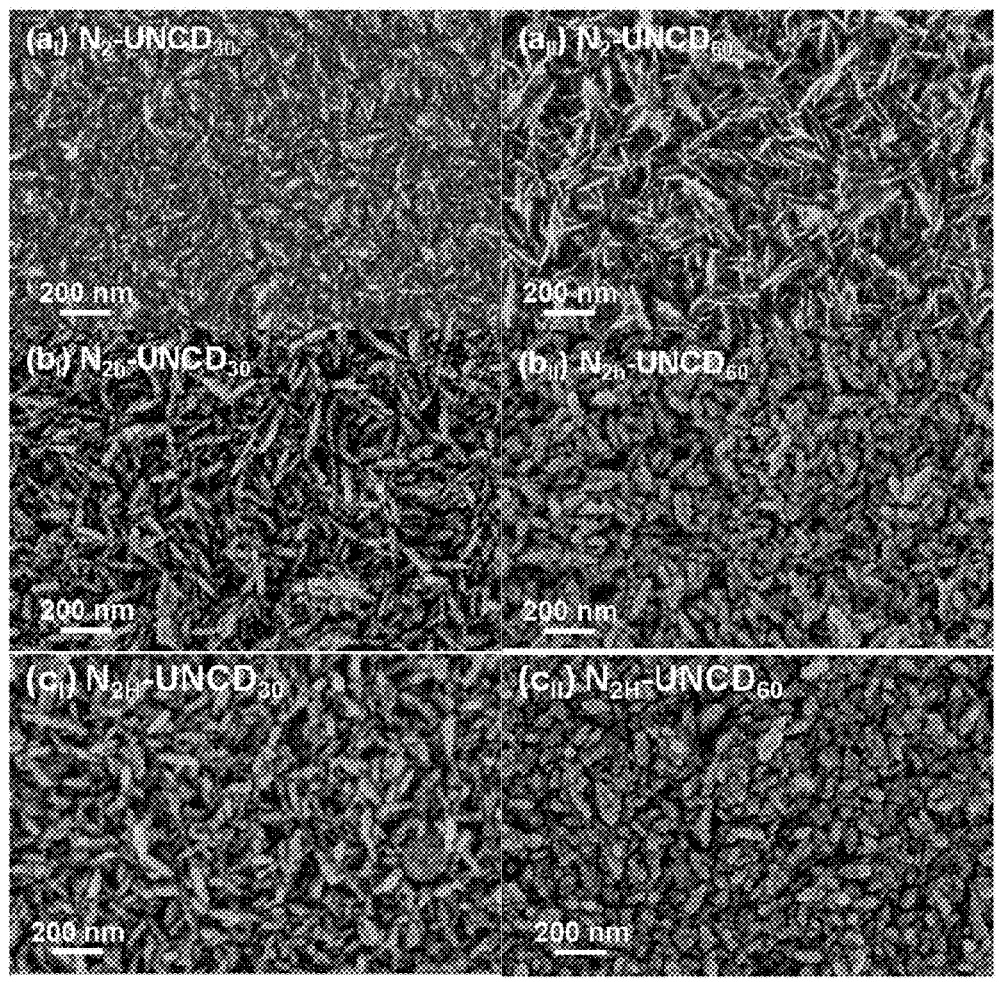
FIG. 4 is an image of a scanning electron microscope (SEM in short below), and describes a micrograph of the examples (E1, E2), the comparative example 1 (CE1), the comparative example 2 (CE2), a comparative example 3 (CE3), and a comparative example 4 (CE4) of the present invention.

With reference to an SEM image of FIG. 4, it can be known that after plasma treatment of 30 min is implemented on the example 1 (E1) under a mixed gas with content of $H_2$ being 0%, equi-axed ultrananocrystalline diamond (UNCD) in the carbon-based composite material layer have transformed into nano needle-like diamond grains [referring to FIG. 4($a_1$)]; in addition, after plasma treatment of 60 min is implemented on the example 2 (E2), shapes of nano needle-like diamond grains thereof become sharper [referring to FIG. 4($a_{11}$)], implying that extending the preparation time for which the plasma treatment is implemented is enough to improve electrical and EFE properties of the carbon-based composite material layer. After plasma treatment of 30 min is implemented on the comparative example 1 (CE1) of the present invention under a mixed gas with content of $H_2$ being 0.1%, equi-axed UNCD in the carbon-based composite material layer transform into nano rod-like diamond grains with round shapes [referring to FIG. 4($b_1$)]; in addition, after plasma treatment of 60 min is also implemented on the comparative example 3 (CE3) under the mixed gas with content of $H_2$ being 0.1%, lengths of nano rod-like diamond grains thereof are further reduced [referring to FIG. 4($b_{11}$)]. Further, with reference to FIG. 4($c_1$) and FIG. 4($C_{11}$), with the content of $H_2$ in the mixed gas being increased to 1.0%, after plasma treatments of 30 min and 60 min are respectively implemented on the comparative example 2 (CE2) and the comparative example 4 (CE4) of the present invention, anisotropic growth is obviously inhibited.

Figure 5:
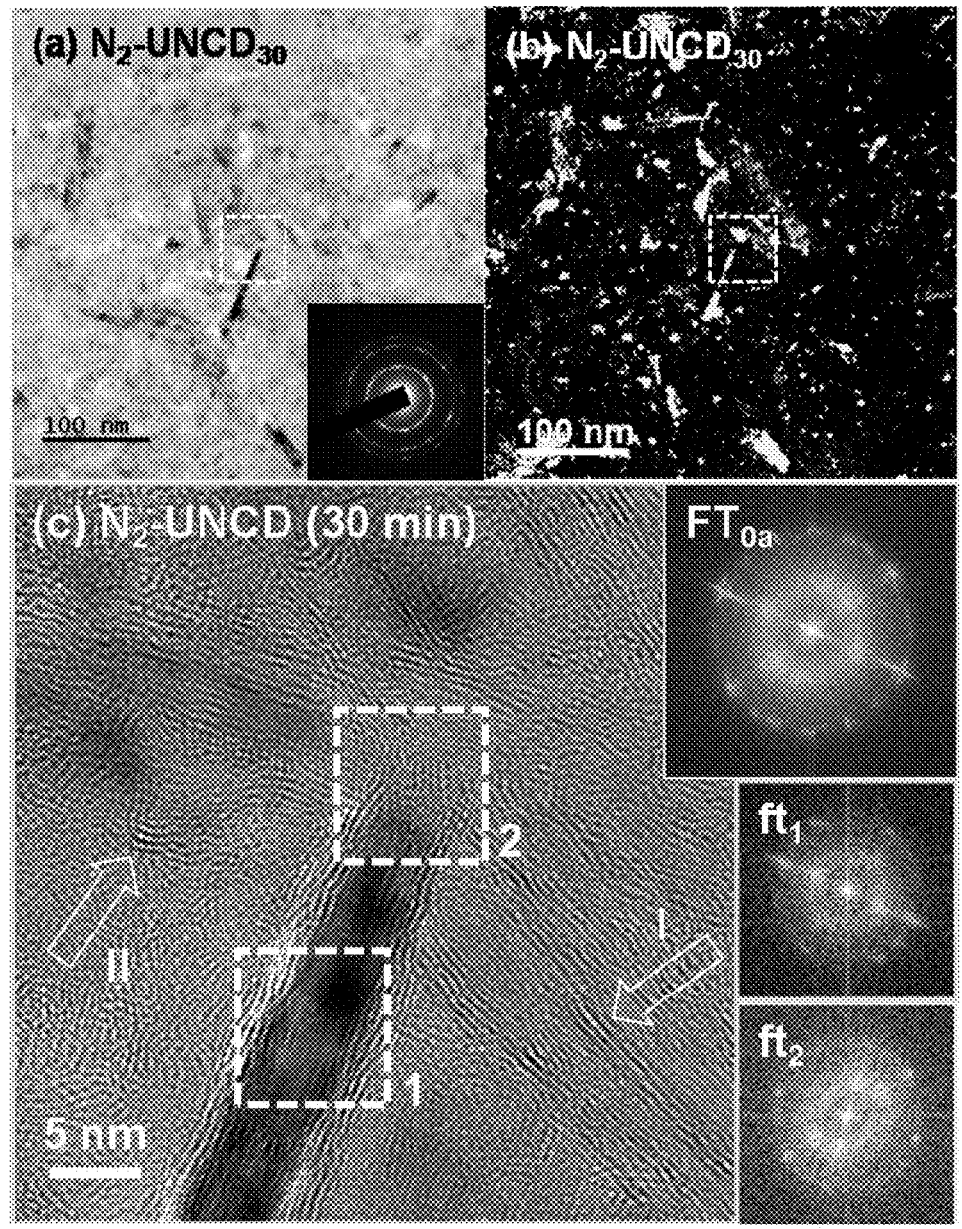
FIG. 5 is TEM analysis data, and describes a micro image and a crystal structure thereof of the example 1 (E1) of the present invention.

With reference to TEM analysis data displayed in FIG. 5, it can be known that after plasma treatment of 30 min is implemented on the example 1 (E1) of the present invention under a mixed gas with content of $H_2$ being 0%, equi-axed ultrananocrystalline diamond (UNCD) grains have transformed into nano needle-like diamond grains [referring to FIG. 5($a$) and FIG. 5($b$)]; in addition, according to the SAED drawing inserted in the lower right corner of FIG. 5($a$), it can be known that the example 1 (E1) displays diffraction rings that correspond to crystal faces (111), (220), (311), and the like of diamonds, and it is verified that the example 1 (E1) is mainly formed of a diamond material. Further, according to a dark field micro image of FIG. 5($b$), it can be known that a large quantity of ultra small spherical diamond grains that coexist with nano needle-like diamond grains are obviously displayed, indicating that the ultra small spherical diamond grains are tail end images of the nano needle-like diamond grains, and it is verified that the example 1 (E1) of the present invention has completely transformed into nano needle-like diamond grains after the plasma treatment. In addition, FIG. 5($a$) only displays nano needle-like diamond grains with a wire diameter ($\xi$) and a length (l) being respectively about 5 nm and 100 nm [that is, an aspect ratio is about 20], and equi-axed ultrananocrystalline diamond (UNCD) aggregates are not observed, and it is further verified that the equi-axed ultrananocrystalline diamond (UNCD) aggregates have loose structures, and are vulnerable to pyrolysis by plasma in the plasma treatment process so as to generate a phase transformation.

Further referring to an HRTEM image [referring to FIG. 5($c$)] marked by a dotted box in FIG. 5($a$), it can be known that it is preliminarily verified that after the plasma treatment, the carbon-based composite material layer of the example 1 (E1) generates a phase transformation into nano needle-like diamond grains wrapped by a plurality of nano graphite layers (that is, the nano graphite phases), and the nano graphite layers regularly wrap the nano needle-like diamond grains. Further, according to an FT diffractogram ($FT_{0a}$ diffractogram) inserted in the upper right corner of FIG. 5($c$), it can be known that diffraction spots arranged in a circular shape are displayed, indicating that nano needled-like diamond grains arranged in any direction exist in the example 1 (E1). In addition, according to diffuse rings in a donut shape displayed in the center of the FT diffractogram ($FT_{0a}$ diffractogram) of FIG. 5($c$), it indicates that the curved fringes are nano graphite clusters, that is, the graphene-like. FT diffractograms in areas 1 and 2 marked by dotted boxes of FIG. 5($c$) are an $ft_1$ diffractogram and an $ft_2$ diffractogram, and it is verified that after the plasma treatment, the carbon-based composite material layer of the example 1 (E1) of the present invention is ultra-nano-carbon composites formed by nano needle-like diamond grains wrapped by nano graphite layers.

Figure 6:
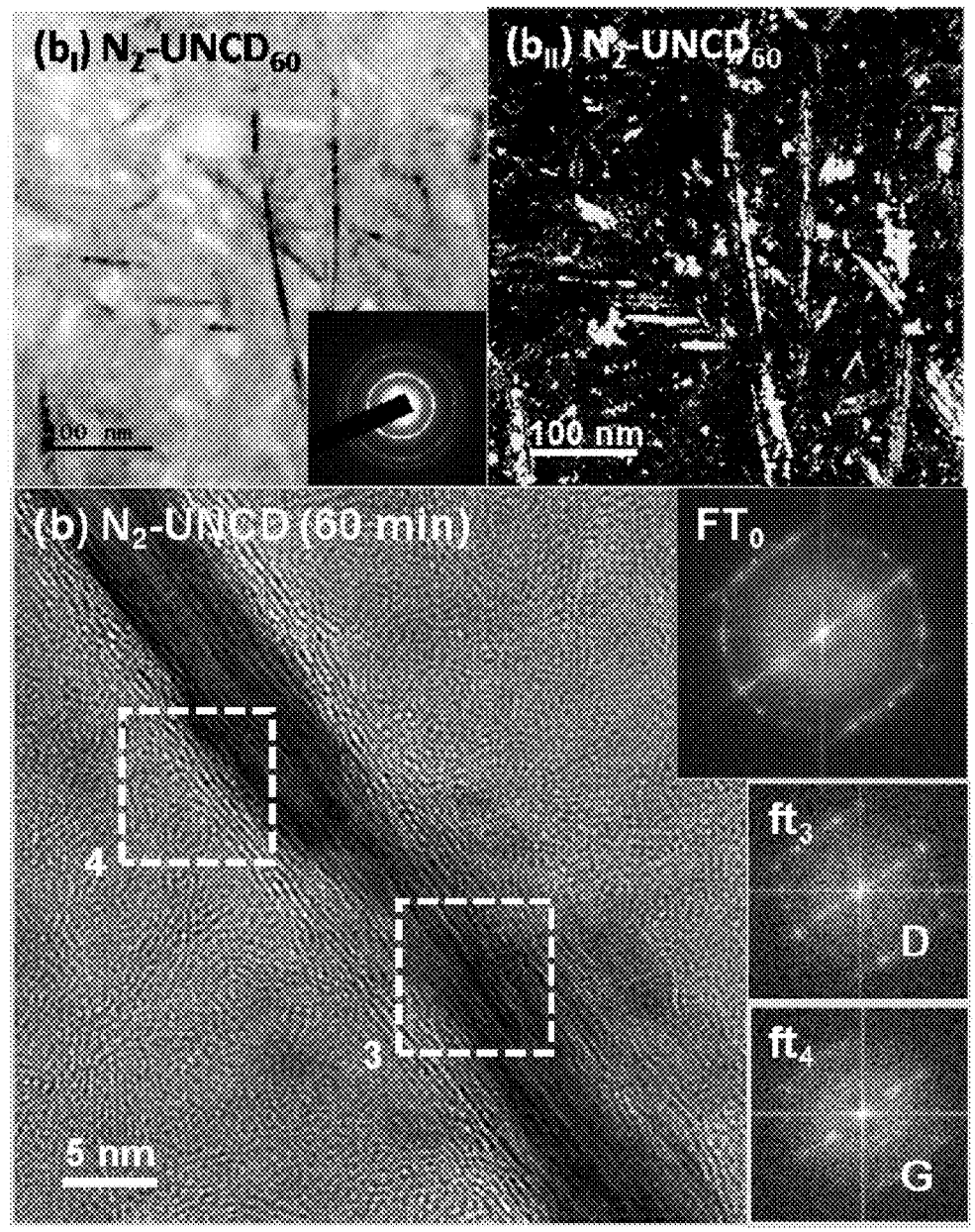
FIG. 6 is TEM analysis data, and describes a micrograph and a crystal structure thereof of the example 2 (E2) of the present invention.

With reference to TEM analysis data displayed in FIG. 6, it can be known that after plasma treatment of 60 min is implemented on the example 2 (E2) of the present invention under a mixed gas with content of $H_2$ being 0%, equi-axed ultrananocrystalline diamond (UNCD) grains have transformed into nano needle-like diamond grains [referring to FIG. 6($a$)]; in addition, according to the SAED drawing inserted in the lower right corner of FIG. 6($a$), it can be known that the example 2 (E2) displays diffraction rings of diamond grains, and it is verified that the example 2 (E2) is mainly formed of a diamond material. In addition, the wire diameter ($\xi$) and length (l) of the nano needle-like diamond grains displayed in FIG. 6($a$) are respectively about 3-5 nm and hundreds of nanometers, and the aspect ratio thereof is improved to about 80-100.

Further referring to an HRTEM image [referring to FIG. 6($c$) marked by a dotted box in FIG. 6($a$)], it can be known that it is preliminarily verified that after the plasma treatment, the carbon-based composite material layer of the example 2 (E2) generates a phase transformation into nano needle-like diamond grains wrapped by about ten nano graphite layers, and the nano graphite layers regularly wrap the nano needle-like diamond grains. According to an FT diffractogram ($FT_{0b}$ diffractogram) inserted in the upper right corner of FIG. 6(c), it can be known that diffraction spots arranged in a circular shape are displayed, indicating that nano needled-like diamond grains arranged in any direction exist in the example 2 (E2). In addition, diffuse rings in a donut shape are displayed in the center of the FT diffractogram ($FT_{0b}$ diffractogram) of FIG. 6(c), and it indicates that nano graphite clusters exist, that is, the graphene-like. FT diffractograms in areas 3 and 4 marked by dotted boxes of FIG. 6(c) are an $ft_3$ diffractogram and an $ft_4$ diffractogram, and it is verified that after the plasma treatment, the carbon-based composite material layer of the example 2 (E2) of the present invention is ultra-nano-carbon composites formed by nano needle-like diamond grains wrapped by nano graphite layers. Therefore, it can be preliminarily derived that the example 2 (E2) has conductivity ($\sigma$) and EFE properties superior to those of the example 1 (E1).

Figure 7:
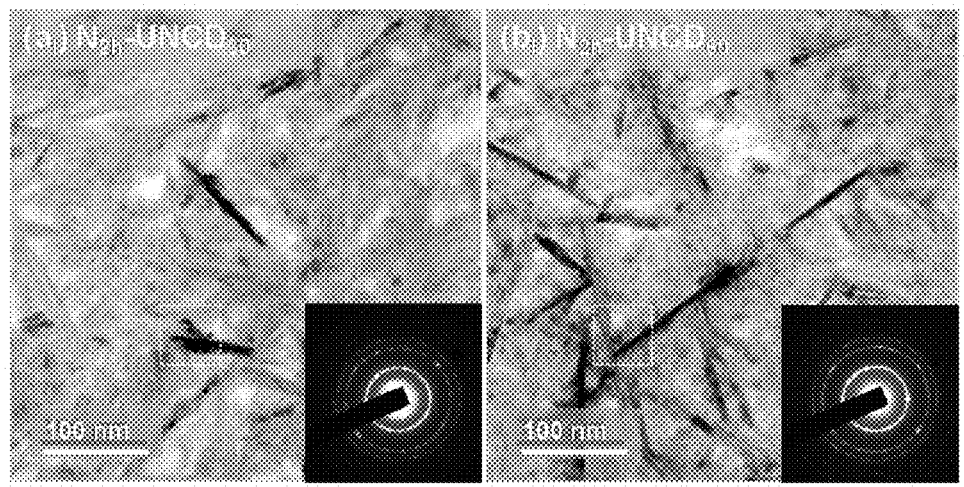
FIG. 7 is TEM analysis data, and describes micro images of the comparative examples (CE1, CE3) of the present invention.

With reference to a TEM image of FIG. 7, it can be known that after plasma treatments of 30 min and 60 min are respectively implemented on the comparative example 1 (CE1) and the comparative example 3 (CE3) of the present invention under a mixed gas with content of $H_2$ being 0.1%, equi-axed ultrananocrystalline diamond (UNCD) have transformed into nano needle-like diamond grains [referring to FIG. 7(a) and FIG. 7(b)]; in addition, according to the SAED drawing inserted in the lower right corner of FIG. 7(a) and FIG. 7(b), it can be known that the comparative examples (CE1, CE3) also display diffraction rings of diamond grains, and it is verified that the comparative examples (CE1, CE3) are mainly formed of diamond materials.

A micro image of the comparative example 1 (CE1) displayed in FIG. 7(a) is similar to that of the example (E1), and an aspect ratio of nano needle-like diamond grains thereof approaches about 20. However, according to an HRTEM image [referring to FIG. 8(a)] taken from an area marked by a dotted box of FIG. 7(a), it can be known that nano graphite layers that wrap nano needle-like diamond grains of the comparative example 1 (CE1) are reduced, and another nano needle-like diamond grain is introduced to form a dendrite-like structure; it can be preliminarily derived that conductivity ($\sigma$) of the comparative example 1 (CE1) is relatively less than that of the example 1 (E1) owing to reduction of the nano graphite layers, and EFE properties are also less than those of the example 1 (E1) owing to the dendrite-like structure.

Figure 8:
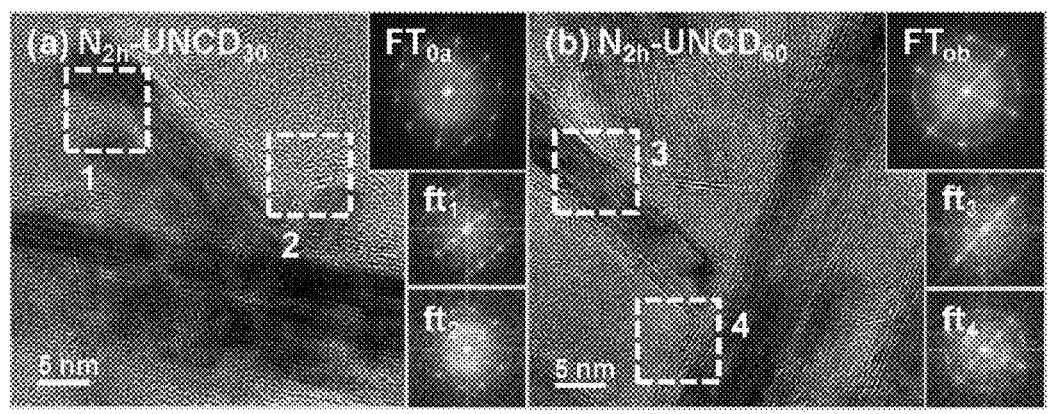
FIG. 8 is an image of a high resolution TEM (HRTEM in short below) of FIG. 7.

With reference to a micro image of the comparative example 3 (CE3) displayed in FIG. 7(b), an aspect ratio of nano needle-like diamond grains thereof is increased; however, according to display of an HRTEM image [referring to FIG. 8(b)] taken from an area marked by a dotted box of FIG. 7(b), it can be known that although the nano needle-like diamond grains are wrapped by nano graphite layers, with preparation time of the plasma treatment being extended to 60 min, the number of dendrite-like structures therein is greater than that of the comparative example 1 (CE1). It can be derived that conductivity ($\sigma$) and EFE properties of the comparative example 3 (CE3) are lower than those of the comparative example 1 (CE1).

It is derived according to a mixed gas (that is, content of $H_2$ is 0.1%) used when the plasma treatment is implemented on the comparative examples (CE1, CE3) that a growth mechanism of the foregoing dendrite-like structure is caused by that nano graphite layers wrapping nano needle-like diamond grains are etched by hydrogen plasma, so that the missing nano graphite layers induce combination of adjacent nano needle-like diamond grains. It is further derived according to the foregoing growth mechanism that after plasma treatments of 30 min and 60 min are respectively implemented on the comparative example 2 (CE2) and the comparative example 4 (CE4) under a mixed gas with content of $H_2$ being 1.0%, the quantity of the etched part of the nano graphite layers thereof and the phenomenon that the adjacent nano needle-like diamond grains are combined are more prominent. Therefore, electrical properties and EFE properties of the comparative example 2 (CE2) and the comparative example 4 (CE4) are relatively lower than those of the comparative example 1 (CE1) and the comparative example 3 (CE3).

Figure 9:
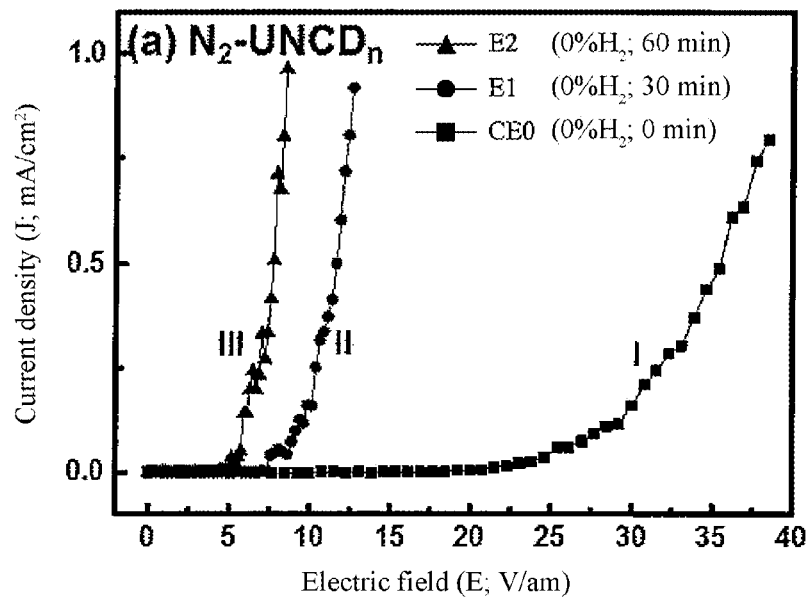
FIG. 9 is a graph of current density (J) versus electric field (E), and describes EFE properties of the comparative example 0 (CE0) and the examples (E1, E2) of the present invention.

With reference to FIG. 9, under the condition that the plasma treatment is not implemented on the comparative example 0 (CE0) of the present invention, the turn on electric field ($E_0$) thereof has reached up to 16.7 V/μm, and the applied electric field ($E_a$) needed to reach a current density (J) of 0.7 mA/cm² is 33.0 V/μm (referring to table 5. below). However, after plasma treatments of 30 min and 60 min are respectively implemented on the examples (E1, E2) under a mixed gas with content of $H_2$ being 0%, the turn on electric fields ($E_0$) thereof have respectively decreased to 5.84 V/μm and 4.21 V/μm, and the applied electric fields ($E_a$) needed to reach current densities (J) of 0.7 mA/cm² and 1.0 mA/cm² respectively are only 11.8 V/μm and 6.5 V/μm respectively (referring to table 5. below).

TABLE 5

| Embodiment[a] | Preparation time (mins) | Content of $H_2$ (vol %) | $E_0$ (V/μm) | J@$E_a$ (mA/cm²)@(V/μm) | $\sigma$ (S/cm) |
|---|---|---|---|---|---|
| CE0 | — | — | 16.70 | 0.7@33.0 | — |
| E1 | 30 | 0.0 | 5.84 | 0.7@11.8 | 750 |
| CE1 | 30 | 0.1 | 7.54 | 0.6@17.5 | 384 |
| CE2 | 30 | 1.0 | 8.13 | 0.6@15.5 | 347 |
| E2 | 60 | 0.0 | 4.21 | 0.7@6.5 | 1099 |
| CE3 | 60 | 0.1 | 15.55 | 0.6@25.2 | 315 |
| CE4 | 60 | 1.0 | 22.96 | 0.6@37.5 | 201 |

[a]each silicon substrate is not heated; the bias voltage (Vb) provided for each silicon substrate is −250 V.

Figure 10:
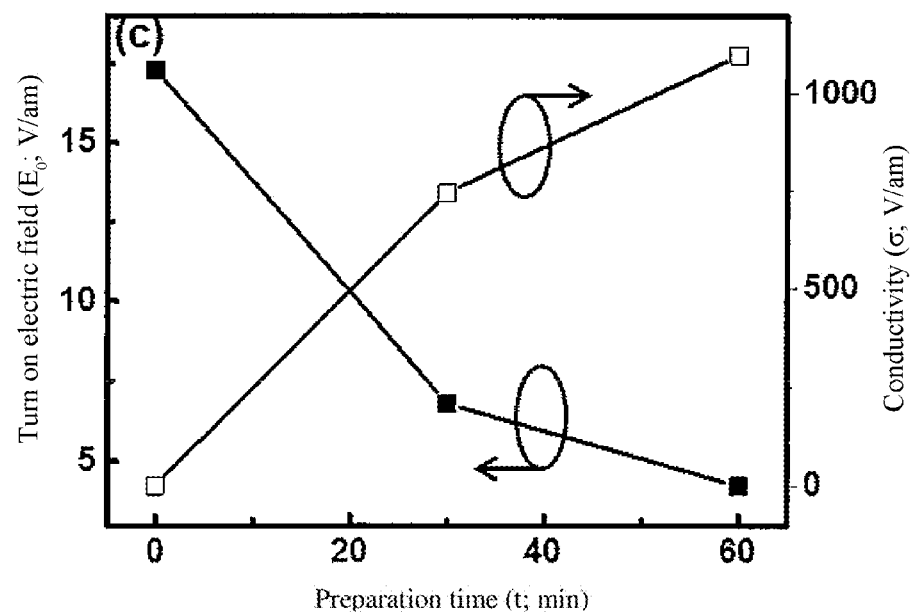
FIG. 10 is a graph of a turn on electric field ($E_0$) and conductivity ($\sigma$) versus preparation time of the comparative example 0 (CE0) and the examples (E1, E2) of the present invention.

In addition, a result of a Hall measurement by van der Pauw configuration indicates (referring to FIG. 10 in cooperation) that the turn on electric fields ($E_0$) of the comparative example 0 (CE0) and the examples (E1, E2) decrease with the increase of the preparation time in the plasma treatment, and the conductivity ($\sigma$) increases to 1099 S/cm from about nearly 0 S/cm (referring to above table 5.).

Figure 11:
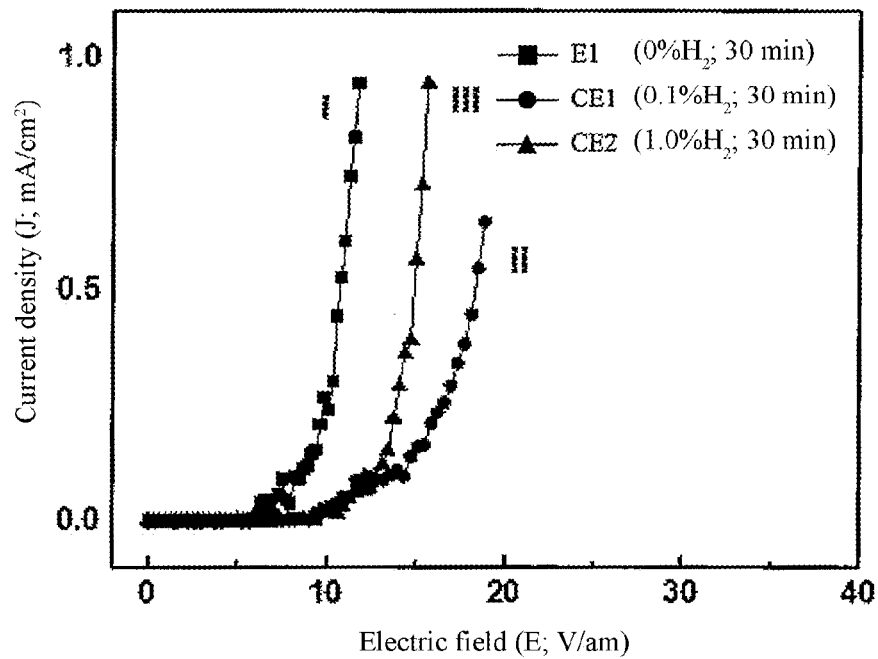
FIG. 11 is a graph of current density (J) versus electric field (E), and describes EFE properties of the comparative examples (CE1, CE2) and the example 1 (E1) of the present invention.

With reference to FIG. 11, after plasma treatment of 30 min is implemented on the example 1 (E1) of the present invention under a mixed gas with content of $H_2$ being 0%, the turn on electric field ($E_0$) thereof is only 5.84 V/μm, and the applied electric field ($E_a$) needed for achieving a current density (J) of 0.7 mA/cm² is only 11.8 V/μm (referring to above table 5.). However, after plasma treatments of 30 min under mixed gases with content of $H_2$ being 0.1% and 1.0% respectively are implemented on the comparative examples (CE1, CE2) of the present invention, $E_0$ thereof have respectively reached up to 7.54 V/μm and 8.13 V/μm, and the applied electric fields ($E_a$) needed for achieving a J of 0.6 mA/cm² have reached up to 17.5 V/μm and 15.5 V/μm respectively (referring to above table 5.).

Figure 12:
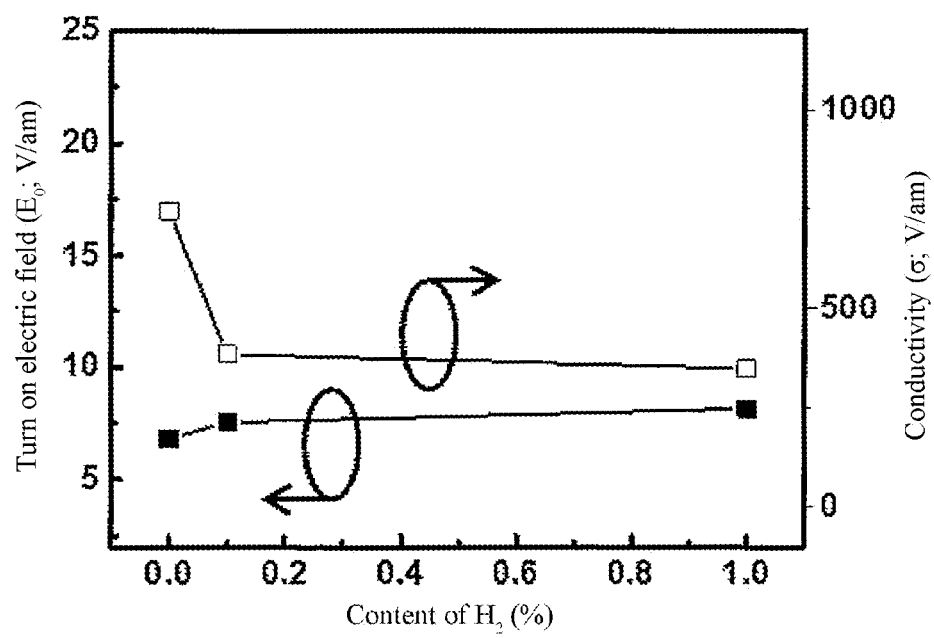
FIG. 12 is a graph of a turn on electric field ($E_0$) and conductivity ($\sigma$) versus H2 content (%) of the comparative examples (CE1, CE2) and the example 1 (E1) of the present invention.

Further, a result of a Hall measurement by van der Pauw configuration indicates (referring to FIG. 12 in cooperation)

that the turn on electric fields ($E_0$) of the comparative examples (CE1, CE2) and the example 1 (E1) increase from 5.84 V/μm to 8.13 V/μm with the increase of the content of $H_2$ of the plasma treatment, and the conductivity (σ) decreases from 750 S/cm to 347 S/cm (referring to above table 5.).

Figure 13:
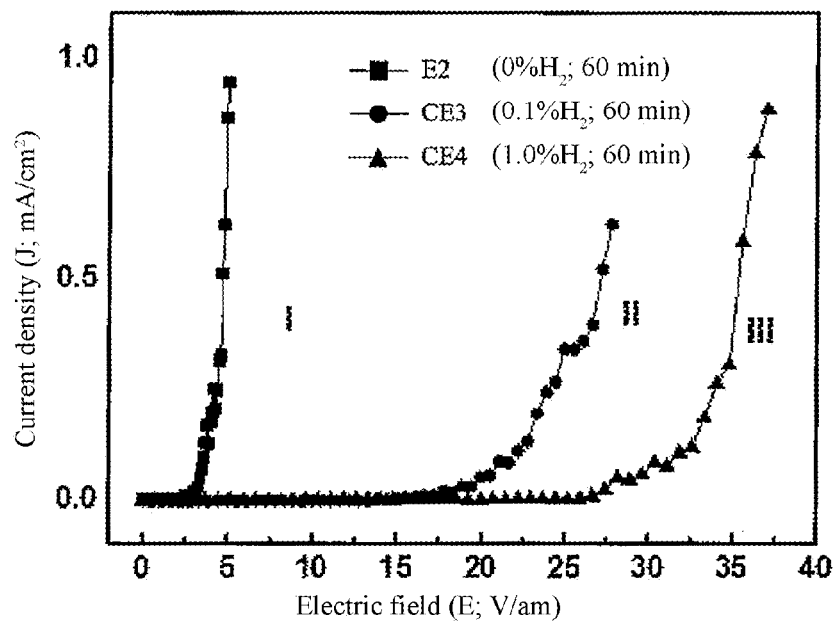
FIG. 13 is a graph of current density (J) versus electric field (E), and describes EFE properties of the comparative examples (CE3, CE4) and the example 2 (E2) of the present invention.

With reference to FIG. 13, after plasma treatment of 60 min is implemented on the example 2 (E2) of the present invention under a mixed gas with content of $H_2$ being 0%, the turn on electric field ($E_0$) thereof is only 4.21 V/μm, and the applied electric field ($E_a$) needed for achieving a current density (J) of 0.7 mA/cm² is only 6.5 V/μm (referring to above table 5.). However, after plasma treatments of 60 min under mixed gases with content of $H_2$ being 0.1% and 1.0% respectively are implemented on the comparative examples (CE3, CE4) of the present invention, $E_0$ thereof have respectively reached up to 15.55 V/μm and 22.96 V/μm, and the applied electric fields ($E_a$) needed for achieving a J of 0.6 mA/cm² is 25.2 V/μm and 37.5 V/μm respectively (referring to above table 5.).

Figure 14:
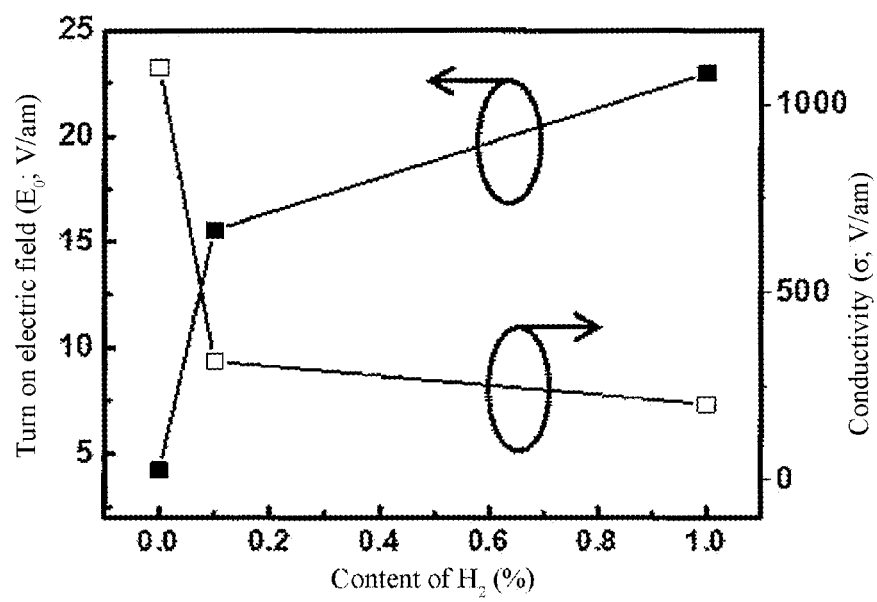
FIG. 14 is a graph of a turn on electric field ($E_0$) and conductivity ($\sigma$) versus H2 content (%) of the comparative examples (CE3, CE4) and the example 2 (E2) of the present invention.

Further, a result of a Hall measurement by van der Pauw configuration indicates (referring to FIG. 14 in cooperation) that the turn on electric fields ($E_0$) of the comparative examples (CE3, CE4) and the example 2 (E2) increase from 4.21 V/μm to 22.96 V/μm with the increase of the content of $H_2$ of the plasma treatment, and the conductivity (σ) decreases from 1099 S/cm to 201 S/cm (referring to above table 5.).

By integrating analysis data results of TEM, EFE properties and electrical properties of the examples (E1, E2) and the comparative examples (CE1, CE2, CE3, CE4), it can be known that the analysis of EFE properties and electrical properties coincides with derivations of the TEM analysis data.

Figure 15:
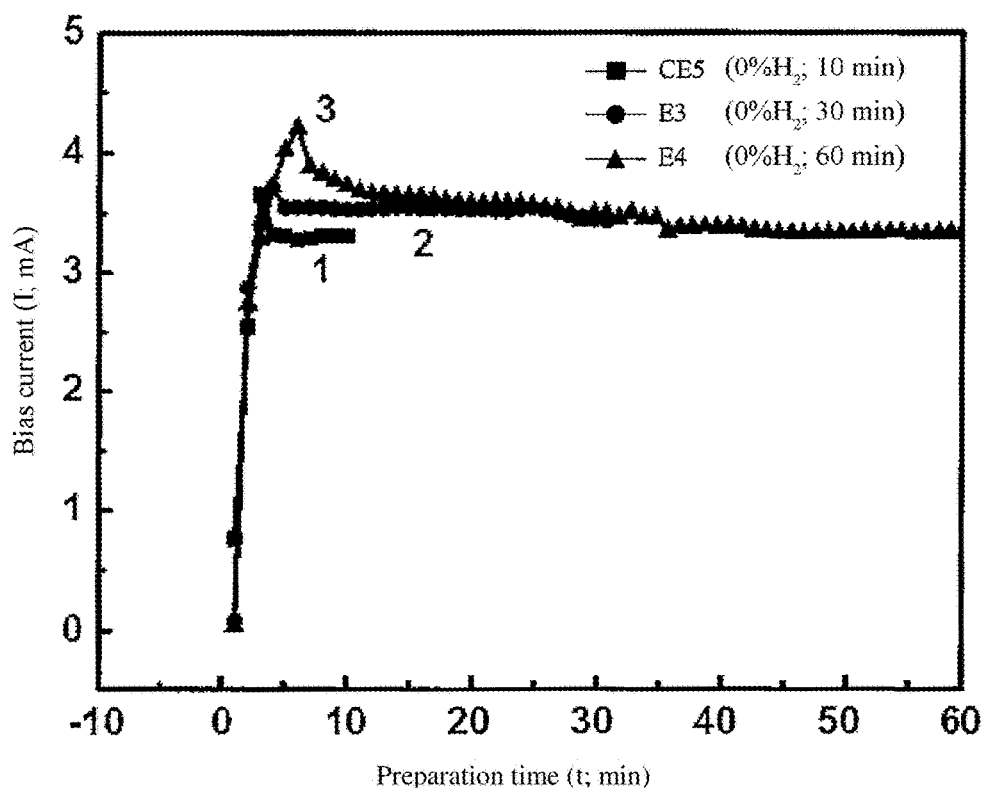
FIG. 15 is a graph of a bias current (I) versus a preparation time (t), and describes changes of a current formed by surface discharge thereof versus a preparation time of plasma treatment in a plasma treatment process of an example 3 (E3), an example 4 (E4), and a comparative example 5 (CE5) of the present invention.

With reference to a graph of a bias current (I) versus a preparation time (t) of FIG. 15, it can be known that in the processes of implementing plasma treatments for 10 min, 30 min, and 60 min respectively under the negative bias voltage (Vb) of −200 V and the working temperature less than 450° C. on the comparative example 5 (CE5), and the examples (E3, E4) of the present invention, surface discharge bias current values of the carbon-based composite material layers rapidly increased with the increase of preparation time thereof, and respectively reach saturation under the bias current of 3.5 mA to 4.2 mA within several minutes, and the increase of the bias currents with the increase of the preparation time is not significant after reaching saturation. It is preliminarily verified that within several minutes, surfaces of the carbon-based composite material layers approximately generate the phase transformation due to plasma treatments thereof into nano needle-like diamond grains wrapped by nano graphite phases with good conductivity (σ); in addition, with the increase of the preparation time, the phase transformation continuously occurs towards the silicon substrate thereof. Analysis data relevant to the phase transformation is described later.

Figure 16:
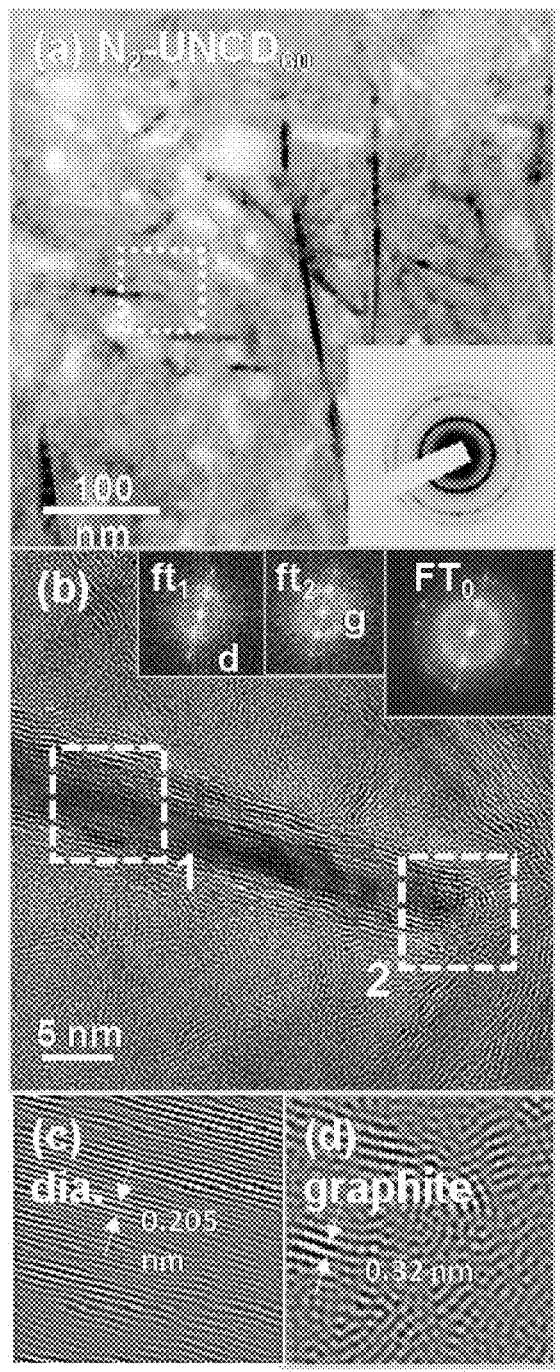
FIG. 16 is TEM analysis data, and describes a micro image and a crystal structure thereof of a surface of the example 4 (E4) of the present invention.

With reference to TEM analysis data displayed in FIG. 16, it can be known that under the condition that the silicon substrate is not additionally heated (that is, the susceptor is bombarded by the plasma species to be naturally heated to a working temperature of 450° C.), after plasma treatment of 60 min is implemented on the example 4 (E4) of the present invention under a mixed gas with content of $H_2$ being 0%, equi-axed ultrananocrystalline diamond (UNCD) located on the surface of the carbon-based composite material layer have transformed into nano needle-like diamond grains with the wire diameter (ξ) and the length (l) being respectively about 3 nm and 150 nm (that is, the aspect ratio thereof is about 50) [referring to FIG. 16(*a*)]; in addition, according to the SAED drawing inserted in the lower right corner of FIG. 16(*a*), it can be known that the example 4 (E4) displays diffraction rings of diamond grains, and it is verified that the example 4 (E4) is mainly formed of a diamond material. Further referring to an HRTEM image [referring to FIG. 16(*b*)] marked by a dotted box in FIG. 16(*a*), it can be known that it is preliminarily verified that after the plasma treatment, the carbon-based composite material layer of the example 4 (E4) generates a phase transformation into nano needle-like diamond grains wrapped by about ten nano graphite layers, and the nano graphite layers regularly wrap the nano needle-like diamond grains.

In addition, according to an FT diffractogram ($FT_0$ diffractogram) inserted in the upper right corner of FIG. 16(*b*), it can be known that diffraction spots arranged in a circular shape are displayed, indicating that nano needled-like diamond grains arranged in any direction exist in the example 4 (E4). In addition, diffuse rings in a donut shape are displayed in the center of the FT diffractogram ($FT_0$ diffractogram) of FIG. 16(*b*), it indicates that nano graphite clusters exist, that is, the graphene-like. FT diffractograms in areas 1 and 2 marked by dotted boxes of FIG. 16(*b*) are an $ft_1$ diffractogram and an $ft_2$ diffractogram inserted into FIG. 16(*b*), and it is verified that after the plasma treatment, the carbon-based composite material layer of the example 4 (E4) of the present invention is also ultra-nano-carbon composites formed by nano needle-like diamond grains wrapped by nano graphite layers, and the nano graphite layers completely wrap the nano needle-like diamond grains. Further, inverted FT images respectively corresponding to the $ft_1$ diffractogram and the $ft_2$ diffractogram displayed in FIG. 16(*b*) are respectively displayed in FIG. 16(*c*) and FIG. 16(*d*), and it is verified that a crystal face distance $d_{111}$ of a nano needle-like diamond grain (111) at area 1 marked by a dotted box of FIG. 16(*b*) is 0.205 nm, and area 2 marked by a dotted box of FIG. 16(*b*) is equivalent to graphite with a (0001) crystal distance $d_{0001}$ of 0.32 nm.

Figure 17:
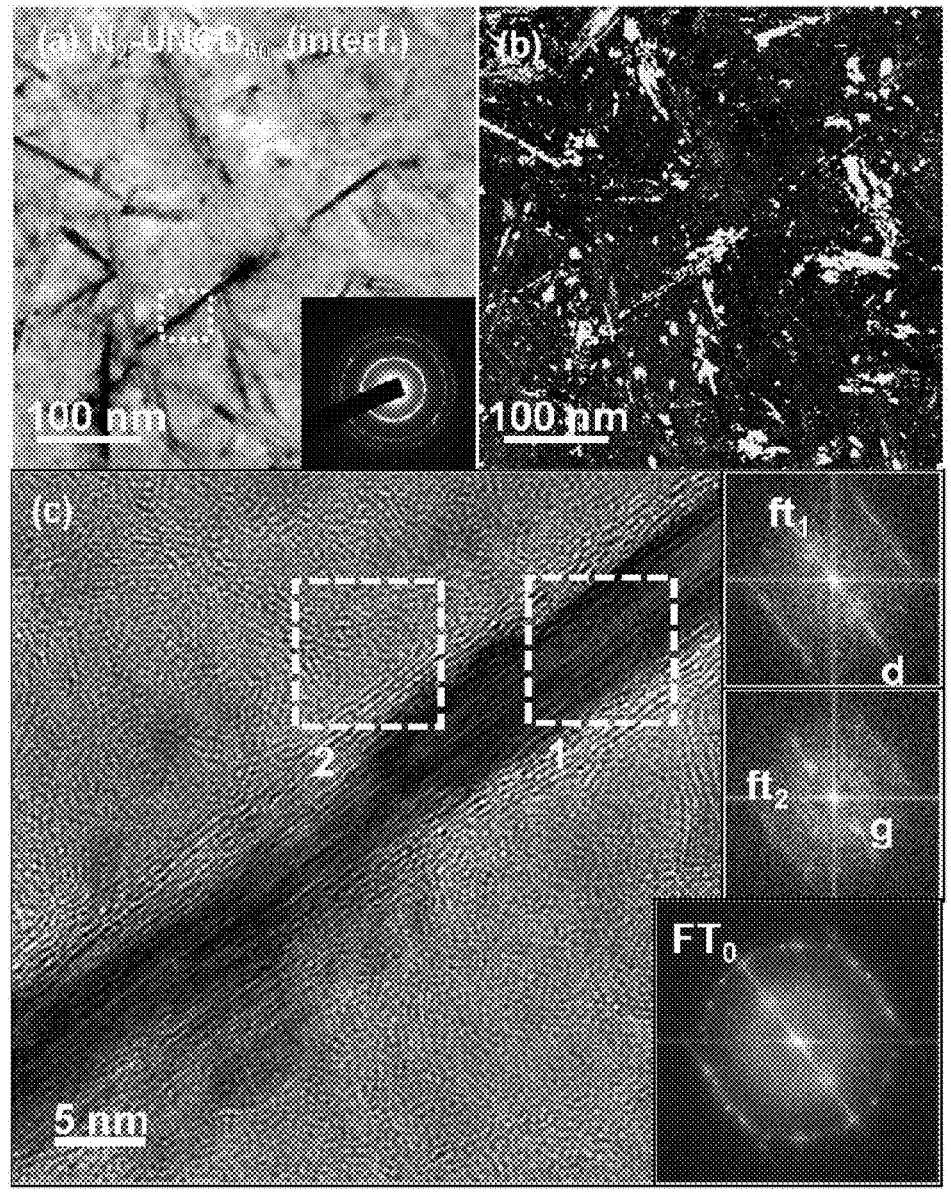
FIG. 17 is TEM analysis data, and describes a micro image and a crystal structure thereof of an interface of the example 4 (E4) of the present invention.

With reference to TEM analysis data displayed in FIG. 17, it can be known that under the condition that the silicon substrate is not additionally heated (that is, the susceptor is bombarded by the plasma species to be naturally heated to a working temperature of 450° C.), after plasma treatment of 60 min is implemented on the example 4 (E4) of the present invention under a mixed gas with content of $H_2$ being 0%, equi-axed ultrananocrystalline diamond (UNCD) grains located on the surface of the silicon substrate and the interface of the carbon-based composite material layer have actually transformed into nano needle-like diamond grains [referring to FIG. 17(*a*)]. In addition, an SAED drawing in FIG. 17(*a*), an HRTEM image, which is taken from the place marked by a dotted box of FIG. 17(*a*), displayed in FIG. 17(*c*), an FT diffractogram (that is, an $FT_0$ diffractogram) of an overall structure of FIG. 17(*c*), FT diffractograms (that is, an $ft_1$ diffractogram and an $ft_2$ diffractogram) corresponding to area 1 marked by a dotted box and area 2 marked by a dotted box in FIG. 17(*c*), and the like are similar to those of FIG. 16. It is verified that after the plasma treatment is implemented on the example 4 (E4), a bottom part of the carbon-based composite material layer thereof generates a phase transformation into nano needle-like diamond grains wrapped by about four nano graphite layers.

Figure 18:
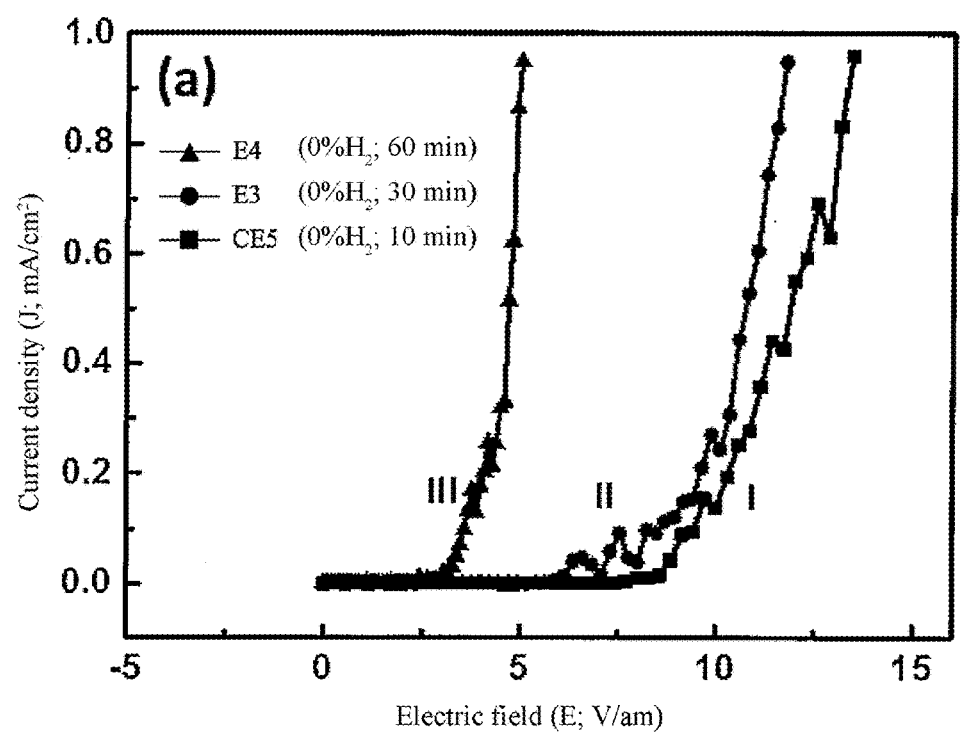
FIG. 18 is a graph of current density (J) versus electric field (E), and describes EFE properties of the examples (E3, E4) and the comparative example 5 (CE5) of the present invention.

With reference to FIG. 18, when plasma treatment of 10 min is implemented on the comparative example 5 (CE5) of the present invention under a mixed gas with content of $H_2$ being 0% in a case in which the silicon substrate is not heated (that is, the susceptor is bombarded by the plasma species to be naturally heated to a working temperature less than 450° C.), the turn on electric field ($E_0$) thereof reaches up to 7.51 V/μm, and the applied electric field ($E_a$) needed for achieving a current density (J) of 1.0 mA/cm² is 20.0 V/μm (referring to table 6. below). However, when preparation time of the plasma treatments on the examples (E3, E4) of the present invention is respectively extended to 30 min and 60 min, $E_0$ thereof have respectively decreased to 5.32 V/μm and 2.48 V/μm, and $E_a$ needed for achieving a J of 1.0 mA/cm² are only 11.8 V/μm and 6.5 V/μm respectively (referring to table 6. below).

TABLE 6

| Embodiment[b] | Preparation time (mins) | Content of $H_2$ (vol %) | $E_0$ (V/μm) | J@$E_a$ (mA/cm²)@(V/μm) | σ (S/cm) |
| --- | --- | --- | --- | --- | --- |
| CE5 | 10 | 0 | 7.51 | 1.0@20.0 | 241 |
| E3 | 30 | 0 | 5.32 | 1.0@11.8 | 746 |
| E4 | 60 | 0 | 2.84 | 1.0@6.5 | 1099 |

[b]the working temperature is 450° C., and the bias voltage (Vb) is −200 V.

Further, a result of a Hall measurement by van der Pauw configuration indicates (referring to above table 6.) that after plasma treatment of a preparation time of 10 min is implemented on the comparative example 5 (CE5), the conductivity (σ) thereof is only 241 S/cm. However, with the preparation time of the plasma treatment being extended to 30 min and 60 min, conductivities (σ) of the examples (E3, E4) are respectively improved to 746 S/cm and 1099 S/cm (referring to above table 6.).

Figure 19:
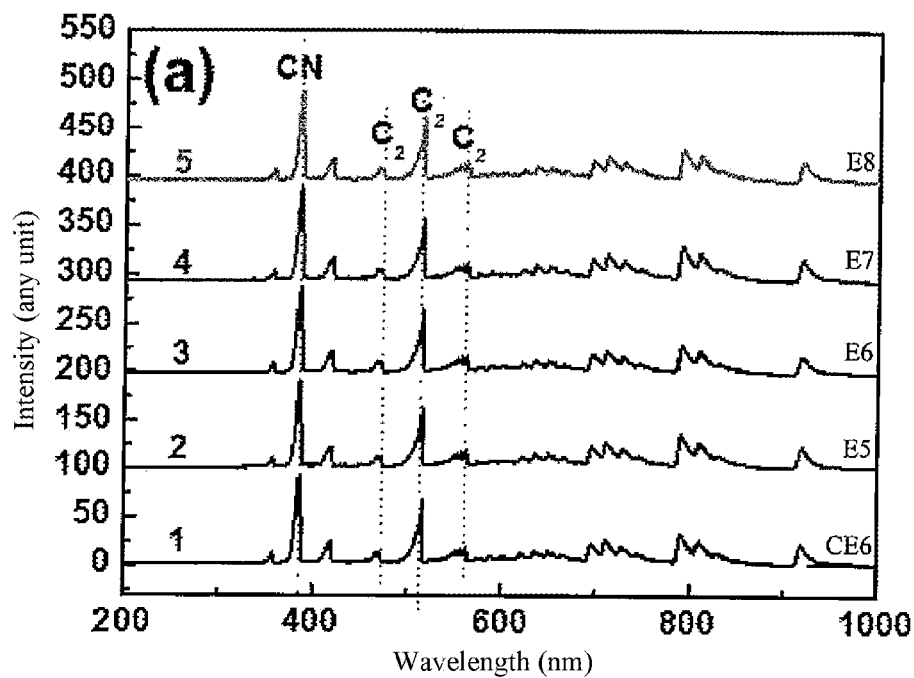
FIG. 19 is a chart of an OES, and describes species spectrum of a comparative example 6 (CE6), an example 5 (E5), an example 6 (E6), an example 7 (E7), and an example 8 (E8) in a plasma environment of the present invention.

FIG. 19 is a chart of an OES of the comparative example 6 (CE6) and the examples (E5, E6, E7, E8) of the present invention. With reference to FIG. 19, it can be known that a Swan band that represents a $C_2$ species is displayed at 470 nm, 512 nm, 560 nm, and the like, and a CN species is displayed at 386 nm, which preliminarily verifies that there is the $C_2$ species and the CN species in a plasma environment of the comparative example 6 (CE6) and the examples (E5, E6, E7, E8) of the present invention. In addition, it can be predicted that a CH species and an H species (not shown) exist in the plasma environment of the comparative example 6 (CE6) and the examples (E5, E6, E7, E8), but the CH species and the H species cannot be detected in the OES chart owing to low concentrations thereof.

Figure 20:
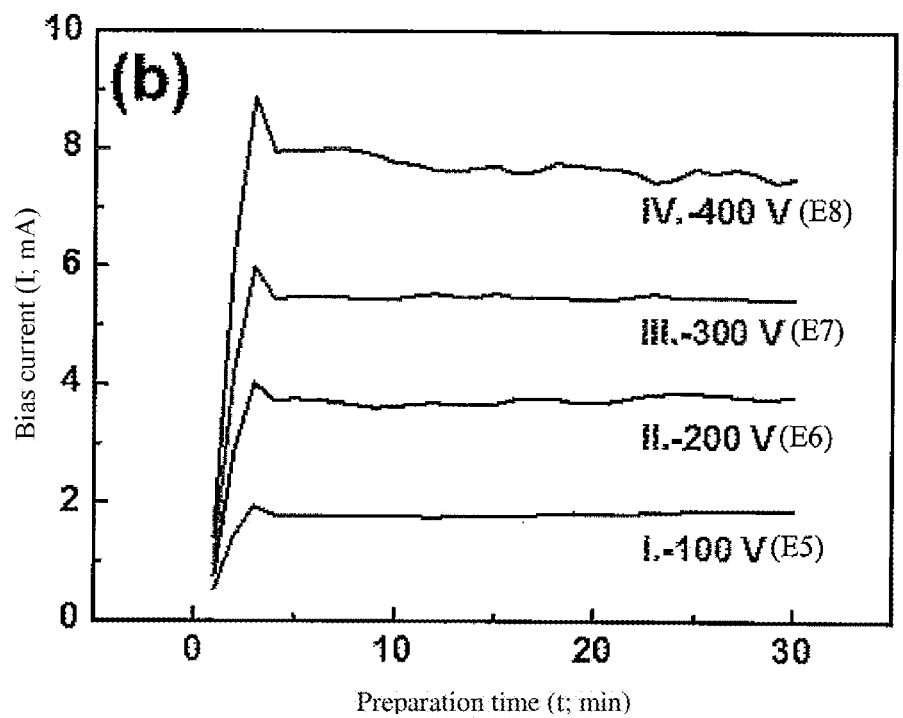
FIG. 20 is a graph of a bias current (I) versus a preparation time (t), and describes changes of a current formed by surface discharge thereof versus a preparation time of plasma treatment in a plasma treatment process of the examples (E5, E6, E7, E8) of the present invention.

With reference to a graph of a bias current (I) versus a preparation time (t) of FIG. 20, it can be known that in the processes of implementing plasma treatments for 30 min under the negative bias voltages (Vb) of −100 V, −200 V, −300 V, and −400 V respectively on the examples (E5, E6, E7, E8) of the present invention, surface discharge bias current values of the carbon-based composite material layers are rapidly increased with the increase of preparation time thereof, and respectively reach saturation under the bias currents of 4 mA, 6 mA, 8 mA, and 9 mA within about 3 minutes respectively, and the increase of the bias currents thereof with the increase of the preparation time is not significant after reaching saturation. It is preliminarily verified that within about 3 minutes, surfaces of the carbon-based composite material layers of the examples (E5, E6, E7, E8) approximately generate the phase transformation due to plasma treatments thereof into nano needle-like diamond grains wrapped by nano graphite phases with good conductivity (σ); in addition, with the increase of the preparation time, the phase transformation continuously occurs towards the silicon substrate thereof. Analysis data relevant to the foregoing phase transformation is described later.

Figure 21:
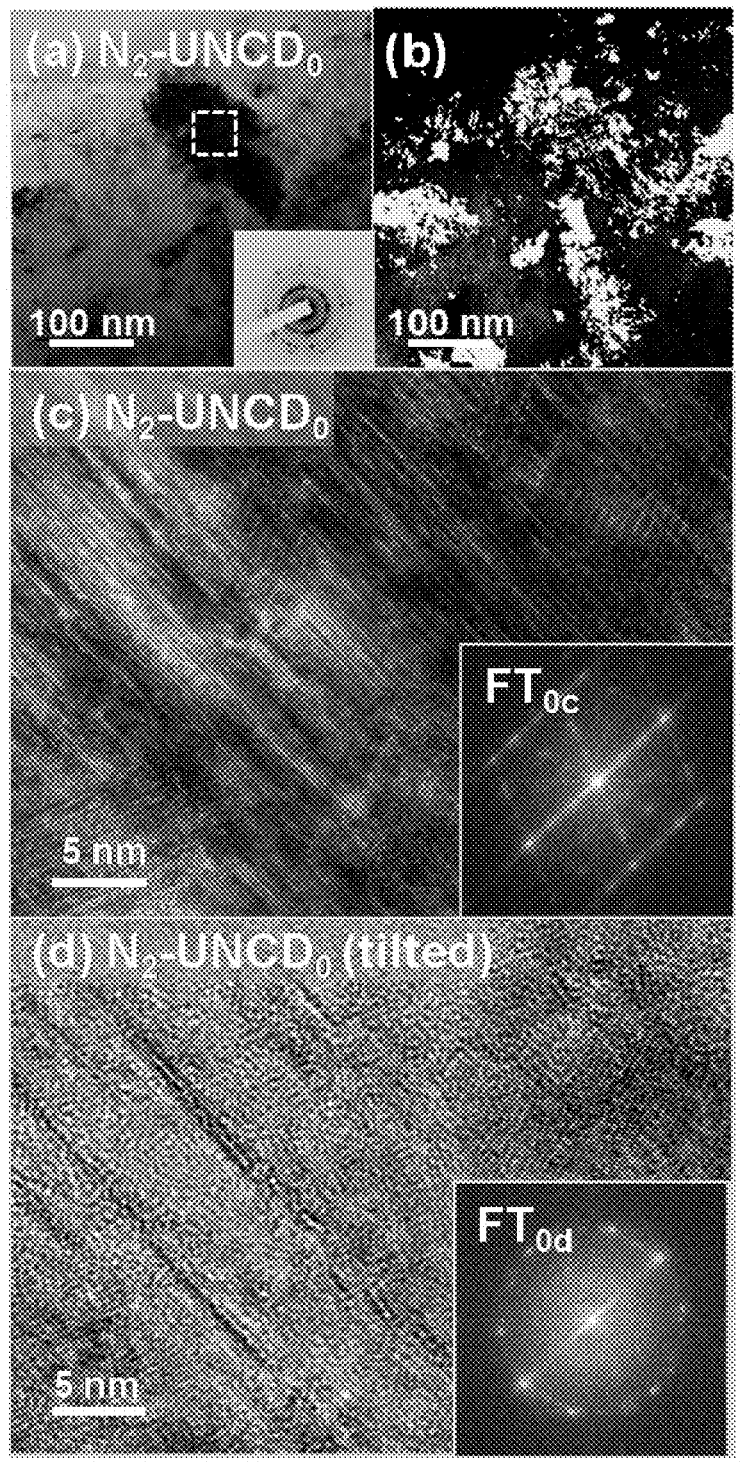
FIG. 21 is TEM analysis data, and describes a micro image and a crystal structure thereof of the comparative example 6 (CE6) of the present invention.

With reference to TEM analysis data displayed in FIG. 21, it can be known that after plasma treatment of 30 min with the negative bias voltage (Vb) of 0 V is implemented on the comparative example 6 (CE6) of the present invention under a mixed gas with content of $H_2$ being 0%, equi-axed ultrananocrystalline diamond (UNCD) aggregates with sizes of about 100 nm to 200 nm are formed [referring to a bright field micrograph of FIG. 21(a)], and according to an SAED drawing inserted in the lower right corner of FIG. 21(a), it is verified that the comparative example 6 (CE6) is mainly a diamond material that has a small part of sp²-bonded carbon. Further, according to a dark field micrograph of FIG. 21(b), it is more obvious that UNCD aggregates are uniformly dispersed everywhere in the comparative example 6 (CE6). FIG. 21(c) displays an HRTEM image taken from the place marked by a dotted box of FIG. 21(a), indicating that the UNCD aggregates form a large monocrystal with a size of about that of a diamond grain; irregular lattice fringes exist in a plurality of areas, and an FT diffractogram (an $FT_0$, diffractogram) introduced in FIG. 21(c) contains array diffraction spots, which are defects in diamonds upon derivation. However, when the comparative example 6 (CE6) is slightly inclined towards a direction away from a zone-axis thereof, the irregular lattice fringes thereof are weakened, and therefore a microstructure located a bottom part of the UNCD is highlighted. In addition, FIG. 21(d) displays a TEM image with high magnification of slightly inclining the comparative example 6 (CE6) towards the direction away from the zone-axis thereof; the lattice fringes are not prominent any more, and only a large quantity of curved fringes remain, and because diffuse rings in a donut shape are displayed in the center of an FT diffractogram (an $FT_{0d}$ diffractogram), it indicates that the aforementioned curved fringes are equivalent to nano graphite phases.

Figure 22:
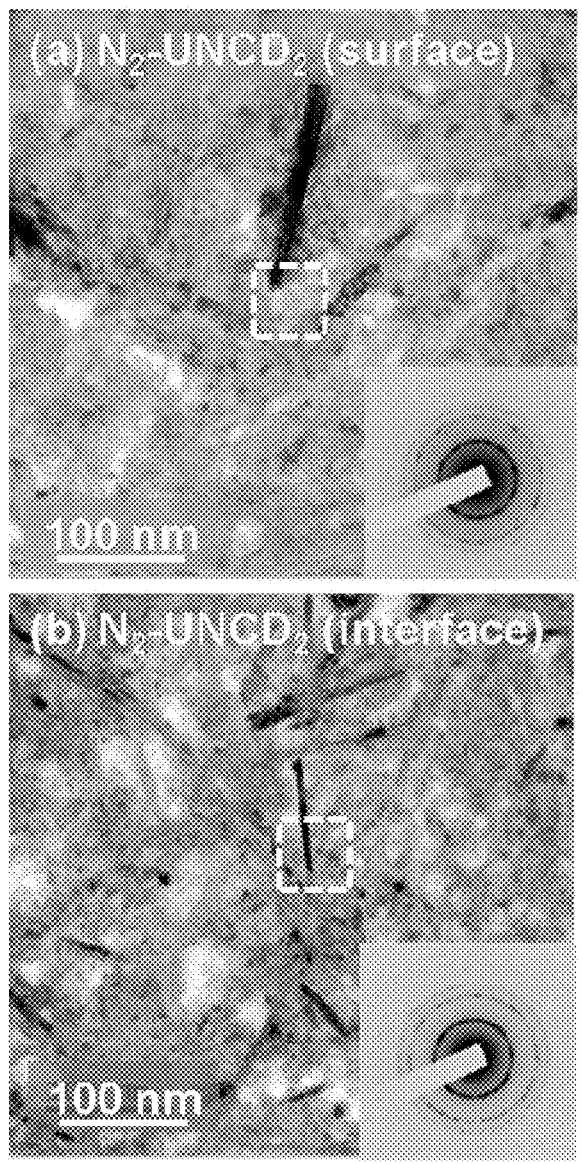
FIG. 22 is an image of a TEM, and describes a micro image of a surface and a micro image of an interface of the example 6 (E6) of the present invention.

With reference to a TEM image displayed in FIG. 22, it can be known that after plasma treatment of 30 min with the negative bias voltage (Vb) of −200 V is implemented on the example 6 (E6) of the present invention under a mixed gas with content of $H_2$ being 0%, no UNCD aggregates exist on the surface region of the example 6 (E6), instead, a large quantity of nano needle-like diamond grains are formed all over the surface region [referring to FIG. 22(a)], and according to an SAED drawing inserted in the lower right corner of FIG. 22(a), it is verified that the surface region of example 6 (E6) is mainly a diamond material. Further, FIG. 23($a_1$) displays an HRTEM image of the surface region of the example 6 (E6), and it is explicitly described that the diamond material on the surface region of the example 6 (E6) is formed by nano needle-like diamond grains and nano graphite layers (about 5-10 layers) that wrap the nano needle-like diamond grains. Structures of the foregoing nano needle-like diamond grains [referring to area 1 marked by a dotted box of FIG. 23($a_I$)] and nano graphite layers [referring to area 2 marked by a dotted box of FIG. 23($a_I$)] are respectively verified by FT diffractograms (that is, an $ft_1$ diffractogram and an $ft_2$ diffractogram).

Figure 23:
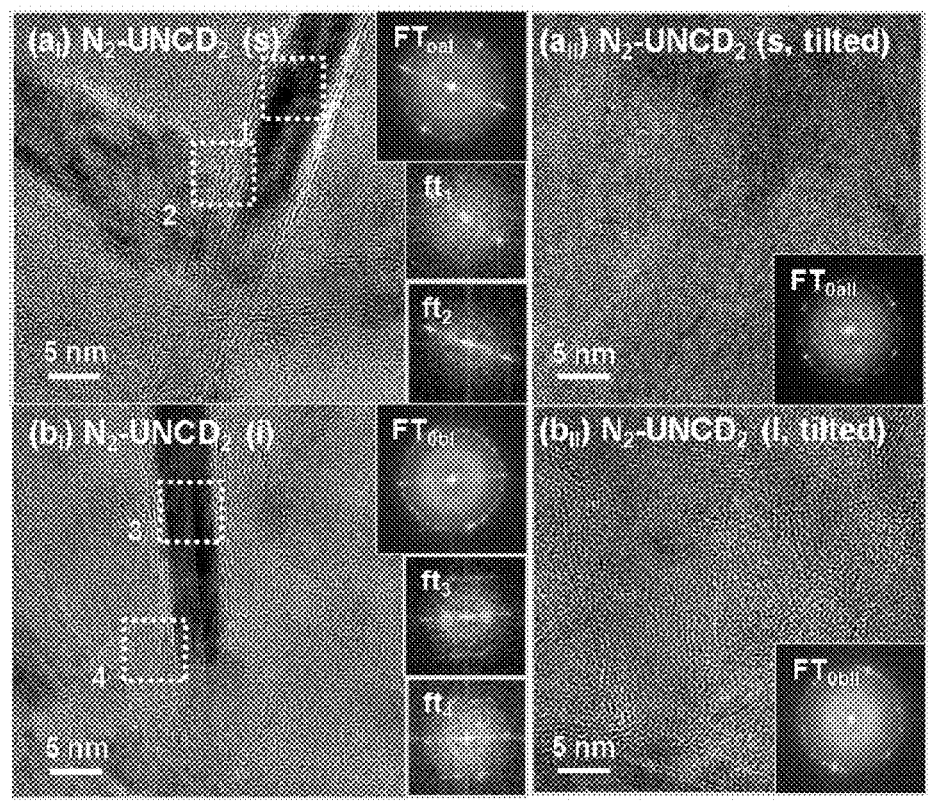
FIG. 23 is an image of an HRTEM of FIG. 22.

Specifically, diffuse rings in a donut shape are displayed in the center of the overall FT diffractogram (that is, an $FT_{0a}$ diffractogram) of FIG. 23($a_1$); upon verification, sp²-bonded carbon having crystallinity is contained on the surface region of the carbon-based composite material layer after the plasma treatment. To facilitate description that a crystal phase located on a boundary of a nano needle-like diamond grain is what makes an image of the nano needle-like diamond grain not obvious, a slightly inclined HRTEM image of the example 6 (E6) [referring to FIG. 23($a_{II}$)] is used for description. FIG. 23($a_{II}$) displays that a weak image of the nano needle-like diamond grain of the example 6 (E6) has a high ratio of nano graphite layers (curved fringes) at the same time; in addition, the inclined FT diffractogram (that is, an $FT_{oc}$ diffractogram) is substantively equivalent to the $FT_{oa}$ diffractogram, and also displays diffraction spots arranged in a circular shape and central diffuse rings in a donut shape, indicating that nano needle-like diamond grains wrapped by the nano graphite layers are uniformly distributed all over the carbon-based composite material layer of the example 6 (E6) after the plasma treatment.

To further verify that the nano needle-like diamond grains wrapped by the nano graphite layers are uniformly distributed all over the overall carbon-based composite material layer, a TEM image between the carbon-based composite material layer and the interface of the silicon substrate after the plasma treatment of the example 6 (E6) is described below [referring to FIG. 22(b), FIG. 23($b_I$), and FIG. 23($b_{II}$)]. A TEM image of FIG. 22(b) has displayed that a bottom part (or interface region) of the carbon-based composite material layer of the example 6 (E6) contains nano needle-like diamond grains that are uniformly dispersed and arranged in any direction. An HRTEM image on the interface region of the example 6 (E6) displayed in FIG. 23($b_I$) also verifies that the bottom part (interface region) of the carbon-based composite material layer contains nano needle-like diamond grains wrapped by nano graphite layers after the plasma treatment. In addition, according to the inclined HRTEM image of FIG. 23($b_I$) [referring to FIG. 23($b_{II}$)], it can be more clearly described that after the plasma treatment, equi-axed ultrananocrystalline diamond (UNCD) grains in the carbon-based composite material layer of the example 6 (E6) have generated a uniform phase transformation into nano needle-like diamond grains wrapped by nano graphite layers.

Figure 24:
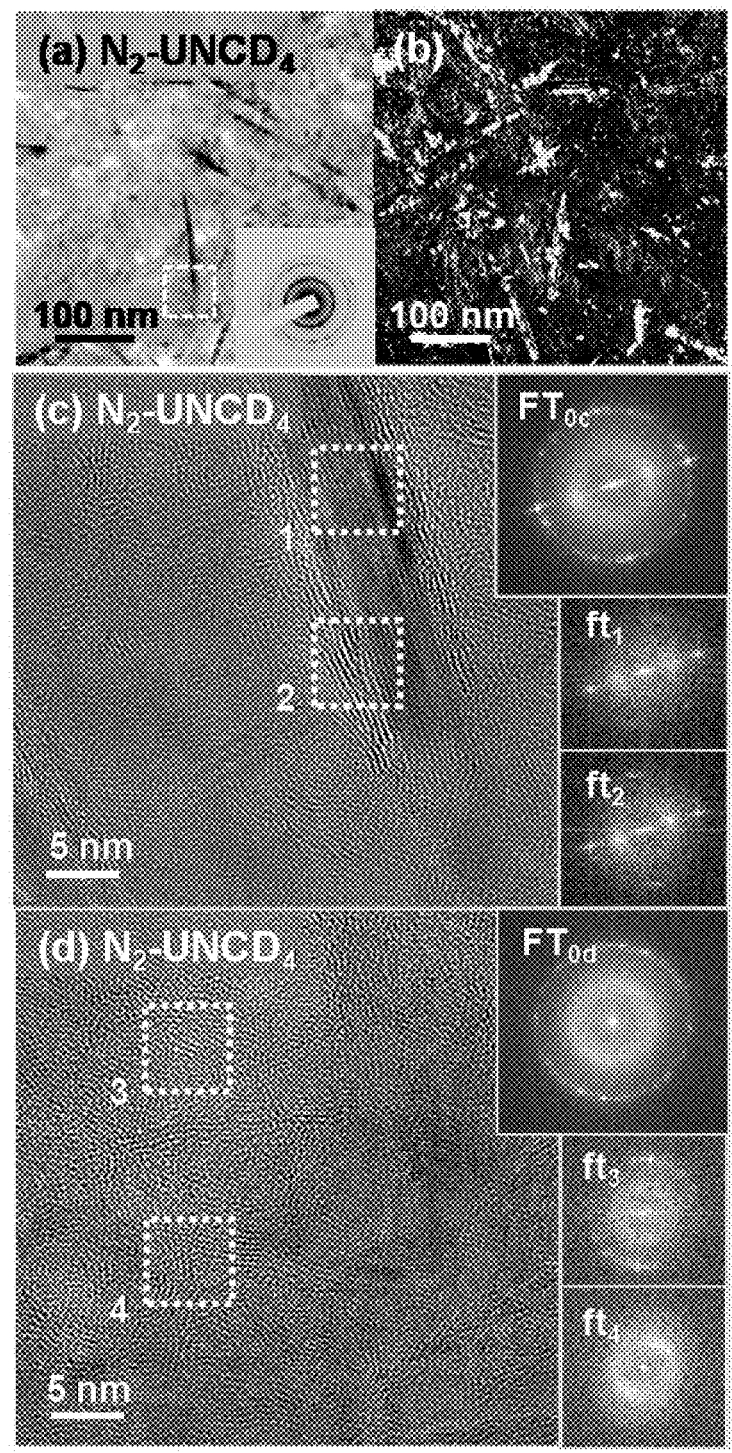
FIG. 24 is TEM analysis data, and describes a micro image and a crystal structure thereof of the example 8 (E8) of the present invention.

With reference to bright field and dark field TEM images respectively displayed in FIG. 24(a) and FIG. 24(b), it can be known that after plasma treatment of 30 min with the negative bias voltage (Vb) of −400 V is implemented on the example 8 (E8) of the present invention under a mixed gas with content of $H_2$ being 0%, nano needle-like diamond grains are uniformed distributed in the carbon-based composite material layer. It can be further verified by an HRTEM image [referring to FIG. 24(c)] of FIG. 24(a) that the carbon-based composite material layer of the example 8 (E8) has contained nano needle-like diamond grains wrapped by a plurality of nano graphite layers after the plasma treatment. In addition, according to the inclined HRTEM image displayed in FIG. 24(d), it is clearly described that images of nano needle-like diamond grains are not prominent any more, and an overall area of an FT diffractogram (that is, an $FT_{od}$ diffractogram) inserted in the upper right corner of FIG. 24(d) is curved fringes; with respect to FIG. 23($a_I$) and FIG. 23($a_{II}$) corresponding to the example 6 (E6), FT diffractograms (that is, an $FT_{oc}$ diffractogram and an $FT_{od}$ diffractogram) corresponding to the overall structures of FIG. 24(c) and FIG. 24(d) not only obviously display diffraction spots [that is, crystal face (111) of diamond] arranged in a circular shape, but also display more complete donut-shaped diffraction rings, indicating that after plasma treatment of −400 V is implemented on the example 8 (E8), the $sp^2$-bonded carbon in the carbon-based composite material layer is a graphite phase with better crystallinity.

Figure 25:
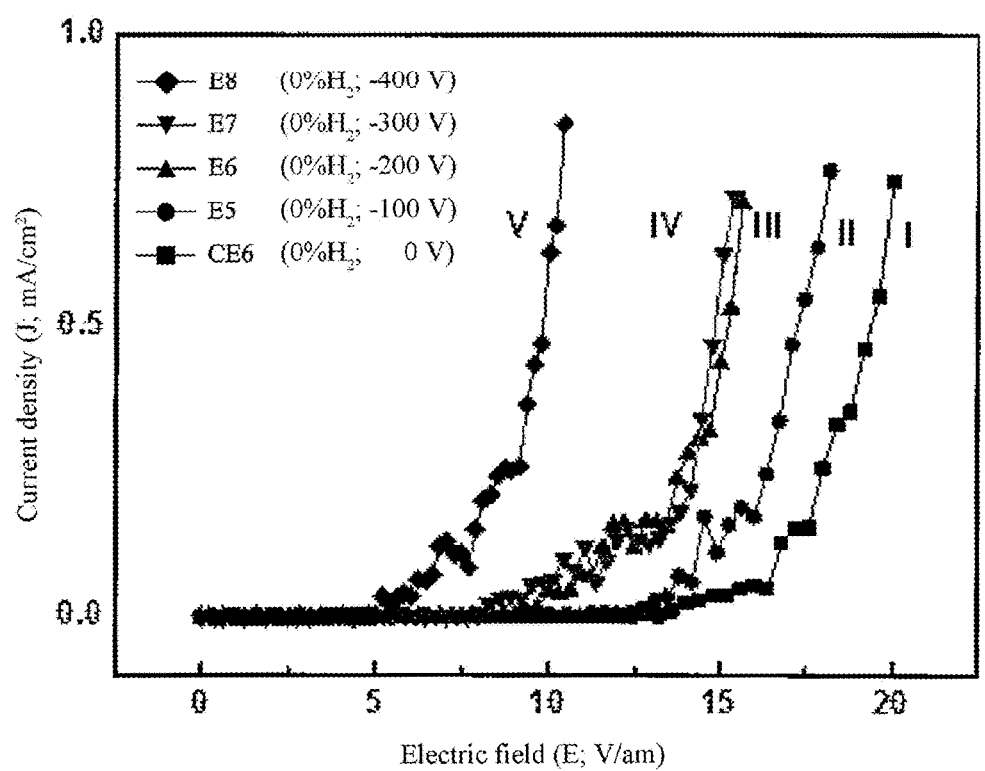
FIG. 25 is a graph of current density (J) versus electric field (E), and describes EFE properties of the examples (E5, E6, E7, E8) and the comparative example 6 (CE6) of the present invention.

With reference to FIG. 25, after plasma treatment of 30 min is implemented on the comparative example 6 (CE6) of the present invention under a mixed gas with content of $H_2$ being 0% in a case in which the negative bias voltage (Vb) provided for the susceptor is 0 V, the turn on electric field ($E_0$) thereof reaches up to 6.8 V/µm, and the applied electric field ($E_a$) needed for attaining a current densities (J) of 0.9 mA/cm$^2$ is 21.05 V/µm (referring to table 7. below). However, when the negative bias voltages (Vb) of the examples (E5, E6, E7, E8) of the present invention are respectively improved to −100 V, −200 V, −300 V. and −400 V, $E_0$ thereof have respectively decreased to 5.65 V/µm, 5.04 V/µm, 4.07 V/µm, and 3.14 V/µm, and $E_a$ needed for attaining a J of 0.9 mA/cm$^2$ decreased to 18.0 V/µm, 15.5 V/µm, 15.0 V/µm, and 10.8 V/µm (referring to table 7. below).

TABLE 7

| Embodiment$^c$ | Preparation time (mins) | Content of $H_2$ (vol %) | Bias voltage (V) | $E_0$ (V/µm) | J@$E_a$ (mA/cm$^2$)@(V/µm) |
| --- | --- | --- | --- | --- | --- |
| CE6 | 30 | 0 | 0 | 6.80 | 0.9@21.05 |
| E5 | 30 | 0 | −100 | 5.65 | 0.9@18.0 |
| E6 | 30 | 0 | −200 | 5.04 | 0.9@15.5 |
| E7 | 30 | 0 | −300 | 4.07 | 0.9@15.0 |
| E8 | 30 | 0 | −400 | 3.14 | 0.9@10.8 |

$^c$each silicon substrate is not heated (that is, the susceptor is bombarded by the plasma species to be naturally heated to a working temperature less than 500° C.).

Further, a result of a Hall measurement by van der Pauw configuration indicates (not shown) that the conductivity (σ) of the example 8 (E8) reaches the highest (1200 S/cm) when the negative bias voltage (Vb) of the susceptor is −400 V.

According to the foregoing detailed description of relevant analysis data of the comparative examples and the examples, it can be known that when the present invention is actually implemented, the susceptor is not additionally heated (that is, the susceptor is bombarded by the plasma species to be naturally heated to a working temperature less than 500° C.), and $E_0$ of the carbon-based composite material layer after the plasma treatment is determined by means of the preparation time in each plasma treatment or the negative bias voltage (Vb) provided for each susceptor. When the susceptor is not heated and the negative bias voltage (Vb) provided for the susceptor is increased [for example, the comparative example 6 (CE6) and the examples (E5-E8), and table 7. may be referred to in cooperation], under the condition that the preparation time in the plasma treatment is reduced to 30 min, the carbon-based composite material layer after the plasma treatment may obtain a turn on electric field ($E_0$) of 3.14 V/µm and a conductivity (σ) of 1200 S/cm, and an applied electric field ($E_a$) needed for attaining a current density (J) of 0.9 mA/cm$^2$ is only 10.8 V/µm. Oppositely, when the susceptor is not additionally heated (that is, the susceptor is bombarded by the plasma species to be naturally heated to a working temperature less than 500° C.) and the preparation time in the plasma treatment is extended [for example, the comparative example 5 (CE5) and the examples (E3, E4), and table 6. may be referred to in cooperation], the negative bias voltage (Vb) provided for the susceptor is relatively reduced to −200 V, so that the carbon-based composite material layer after the plasma treatment can obtain a turn on electric field ($E_0$) of 2.84 V/µm and a conductivity (σ) of 1099 S/cm, and an applied electric field ($E_a$) needed for attaining a current density (J) of 1.0 mA/cm$^2$ is only 6.5 V/µm.

Based on the above, by means of the method for fabricating a carbon-based composite material of the present invention, each susceptor is provided with a respective negative bias voltage (Vb) at a working temperature less than 500° C., so that a plasma treatment is applied to each carbon-based composite material layer in the plasma environment containing a $C_2$ species and a CN species for each preparation time, thereby reducing a turn on electric field ($E_0$) and improving a conductivity ($\sigma$) of the carbon-based composite material layer under a lower-temperature condition. Therefore, the objective of the present invention can be actually achieved.

However, the foregoing are merely preferred embodiments of the present invention; and these embodiments should not limit the implementation scope of the present invention. Simple equivalent changes and modifications made according to content of claims and patent description of the present invention shall fall within the protection scope of the present invention for patent.

What is claimed is:

1. A method for fabricating a carbon-based composite material, comprising:

placing a carbon-based composite material layer containing an amorphous carbon matrix and a plurality of equi-axed ultrananocrystalline diamond grains dispersed in the amorphous carbon matrix in a plasma environment containing a $C_2$ species and a CN species for a plasma treatment; wherein the equi-axed ultrananocrystalline diamond grains have a grain size ($\varphi$), and there is a distance (d) between adjacent equi-axed ultrananocrystalline diamond in the part, where $\varphi \leq 5$ nm and $d \geq 0.05$ nm;

a susceptor that bears the carbon-based composite material layer is provided with a negative bias voltage (Vb), and the susceptor is not additionally heated so that the susceptor is bombarded by the plasma species to be naturally heated to a working temperature less than 500° C.;

the $C_2$ species and CN species in the plasma environment are attracted by the negative bias voltage to the carbon-based composite material layer to make the amorphous carbon matrix between the adjacent equi-axed ultrananocrystalline diamond grains in this part generate a phase transformation, thereby facilitating anisotropic growth of each of the adjacent equi-axed ultrananocrystalline diamond grains in the part into a nano needle-like diamond grain, the nano needle-like diamond grain is an elongated cylindrical grain whose length is greater than its diameter, and each nano needle-like diamond grain is wrapped by layers of graphene; and by a preparation time for which the plasma treatment is applied and the negative bias voltage (Vb) provided for the susceptor, the carbon-based composite material layer after the plasma treatment has a turn on electric field ($E_0$) less than 5.9 V/$\mu$m.

2. The method for fabricating a carbon-based composite material according to claim 1, wherein each nano needle-like diamond grain has a wire diameter ($\xi$) and a length (l), $\xi \leq 5$ nm, and $l \geq 100$ nm, and each nano graphite phase comprises at least three layers of graphene.

3. The method for fabricating a carbon-based composite material according to claim 1, wherein the C2 species and CN species in the plasma environment are formed by pyrolyzing a mixed gas, and the mixed gas contains a hydrocarbon gas molecule and a gas molecule that contains nitrogen.

4. The method for fabricating a carbon-based composite material according to claim 3, wherein the hydrocarbon gas molecule is selected from methane, acetylene, or a combination of methane and acetylene, and the gas molecule that contains nitrogen is nitrogen.

5. The method for fabricating a carbon-based composite material according to claim 4, wherein the hydrocarbon gas molecule is methane; and in volume percent of the mixed gas, methane ranges between 1% and 10% and nitrogen ranges between 90% and 99%.

6. The method for fabricating a carbon-based composite material according to claim 1, wherein the negative bias voltage (Vb) ranges between −50 V and −600 V.

7. The method for fabricating a carbon-based composite material according to claim 6, wherein the negative bias voltage (Vb) ranges between −100 V and −450 V.

8. The method for fabricating a carbon-based composite material according to claim 1, wherein the working temperature is not greater than 450° C.

9. The method for fabricating a carbon-based composite material according to claim 1, wherein the preparation time for which the plasma treatment is applied ranges between 20 min and 90 min.

* * * * *